(12) United States Patent
Pons

(10) Patent No.: US 10,868,147 B2
(45) Date of Patent: Dec. 15, 2020

(54) METHOD OF MANUFACTURING A TRANSISTOR

(71) Applicant: X-FAB FRANCE, Corbeil Essonnes (FR)

(72) Inventor: Nicolas Pons, Draveil (FR)

(73) Assignee: X-FAB FRANCE, Corbeil Essonnes (FR)

( * ) Notice: Subject to any disclaimer, the term of this patent is extended or adjusted under 35 U.S.C. 154(b) by 72 days.

(21) Appl. No.: 16/232,847

(22) Filed: Dec. 26, 2018

(65) Prior Publication Data

US 2019/0221656 A1    Jul. 18, 2019

(30) Foreign Application Priority Data

Dec. 29, 2017 (FR) ..................................... 17 63407

(51) Int. Cl.
| | |
|---|---|
| *H01L 29/66* | (2006.01) |
| *H01L 21/762* | (2006.01) |
| *H01L 29/786* | (2006.01) |
| *H01L 21/28* | (2006.01) |
| *H01L 29/423* | (2006.01) |
| *H01L 27/12* | (2006.01) |

(52) U.S. Cl.
CPC .. *H01L 29/66742* (2013.01); *H01L 21/28123* (2013.01); *H01L 21/76283* (2013.01); *H01L 27/127* (2013.01); *H01L 27/1296* (2013.01); *H01L 29/42372* (2013.01); *H01L 29/78654* (2013.01)

(58) Field of Classification Search
None
See application file for complete search history.

(56) References Cited

U.S. PATENT DOCUMENTS

| | | | | |
|---|---|---|---|---|
| 8,962,399 | B2 * | 2/2015 | Vinet | ................ H01L 21/76248 |
| | | | | 438/151 |
| 2011/0049626 | A1 * | 3/2011 | Lin | ................... H01L 29/66659 |
| | | | | 257/347 |
| 2012/0104498 | A1 * | 5/2012 | Majumdar | .......... H01L 29/7848 |
| | | | | 257/351 |
| 2016/0099311 | A1 | 4/2016 | Tschumakow et al. | |
| 2017/0194425 | A1 | 7/2017 | Lee | |

FOREIGN PATENT DOCUMENTS

EP            3249689 A1      11/2017

\* cited by examiner

*Primary Examiner* — Michelle Mandala
(74) *Attorney, Agent, or Firm* — Hauptman Ham, LLP

(57) ABSTRACT

A method of forming a transistor from a stack of layers comprising at least one insulating layer topped by at least one active layer and at least one first and one second insulating trench defining in the active layer a reception area for receiving the transistor, the transistor comprising a conduction channel formed at least partially in the active layer, the method comprising at least the following steps: forming a grid stack extending over at least the conduction channel; forming a source zone and a drain zone; wherein the formation of the grid stack is carried out in such a way as to provide at least a first and a second portion of the reception zone, not covered by the grid stack.

20 Claims, 16 Drawing Sheets

METHOD OF MANUFACTURING A TRANSISTOR

TECHNICAL FIELD OF THE INVENTION

The present invention concerns the field of microelectronics and nanoelectronics in general. It concerns more particularly the making of MOSFET transistors. A particularly advantageous application of it will be transistors formed on substrates of the semiconductor-on-insulator type.

STATE OF THE ART

In the field of integrated circuits formed from substrates made of semiconductor-on-insulator type substrates, designated by their acronym SOI, for "Semiconductor On Insulator", there are different types of transistors: transistors called partially depleted transistors designated by their acronym PDSOI, for "Partially Depleted Semiconductor On Insulator", and transistors called fully depleted transistors designated by their acronym FDSOI, for "Fully Depleted Semiconductor On Insulator".

An elaborate SOI substrate is characterized by the presence of an active layer formed by a crystalline semiconductor surface layer, monocrystalline silicon for example, resting on a continuous insulating oxide layer, for example silicon oxide, known as buried oxide or "Buried Oxide layer" (BOX). The solidity and mechanical rigidity of the assembly are ensured by a support layer or substrate on which the BOX rests and which constitutes the body of the SOI substrate, often referred to as "bulk" to indicate that the starting substrate is most often made of a solid semiconductor material, for example silicon. This structure offers many advantages for the manufacture of so-called metal-oxide-semiconductor (MOS) transistors. In particular, the presence of the continuous insulating layer allows a drastic reduction in parasitic behaviour.

A transistor can include a source zone and a drain zone arranged on either side of a conduction channel. The source and drain areas and the conduction channel being, for example, formed in the active layer of the SOI substrate. The transistor also includes a grid stack above the active layer and whose sides can be covered by spacers. In addition, a transistor can also include an electrically conductive area with the conduction channel. This situation is generally encountered in the case of a PDSOI transistor.

Finally, it should be noted that transistor reception areas are generally delimited on a substrate by insulating trenches also known as "Shallow Trench Insulation" (STI). These STIs are formed in the active layer so as to spatially compartmentalize the areas of the substrate comprising various transistors. Generally, these insulating trenches include a silicon oxide. Their formation includes etching the active layer and depositing therein silicon oxide.

There is a constant need for high performance integrated circuits, especially in terms of speed and reliability.

Various solutions have been proposed to improve these performances. These solutions are based, for example, on the introduction of mechanical stress into the channel, or on the optimization of the structure and nature of the spacers protecting the sides of the grid to reduce leakage currents or the risk of breakdown, or on the composition and configuration of the source and drain areas. While these solutions lead to some improvement in transistor performance and reliability, it would still be very advantageous to further improve transistor performance and/or reliability, while keeping production costs low.

This is an objective to which this invention proposes to provide a solution.

SUMMARY OF THE INVENTION

The present invention concerns a method of forming a transistor from a stack of layers comprising at least one insulating layer topped by at least one active layer of a semiconductor material and at least first and second insulating trenches passing through the active layer to define in the active layer a reception area for receiving said transistor, said transistor comprising a conduction channel formed at least partially in the active layer, the method comprising at least the following steps:

a) Defining said conduction channel at the reception area comprising at least one of the following steps:
  i) Slimming a portion of the active layer at the reception area to form a thinned active layer, the slimming step comprising at least:
    (1) either the dry and/or wet etching of at least part of the active layer at the reception area, and preferably at least part of the first and/or second insulating trench,
    (2) or the formation of a sacrificial oxide layer by oxidation of a part of the active layer followed by the removal of at least a part of said sacrificial oxide layer,
  ii) thickening of a part of the active layer at the reception area so as to form a thickened reception area, the thickening step comprising at least epitaxial growth of a crystalline, preferably semiconductor, material at the reception area, and preferably at least a part of the first and/or second insulating trench;

b) formation of a grid stack above the at least one said conduction channel, said grid stack extending in a dimension L200, taken in a longitudinal direction (y) above the at least one said conduction channel;

c) formation of a source zone and a drain zone, the source and drain zones being located on either side of said grid stack in a transverse direction (x) of said grid stack, the transverse direction (x) being perpendicular to the longitudinal direction (y);

the method being characterized in that the formation of the grid stack is carried out in such a way as to provide at least first and second exposed portions of the reception area, not covered by said grid stack; said first and second portions each extending from one of the sides of the grid stack and to one of the first and second insulating trenches so that the first and second portions are located on either side of said grid stack in said longitudinal direction (y), and in that the method comprises at least a first step of masking the first and second exposed portions when forming the source and drain areas, preferably so that the first and second exposed portions are not altered or modified when forming the source and drain areas, and/or during a step of modifying the active layer.

Thus, the step of forming the grid stack is carried out in such a way that at least a first exposed portion, i.e. not covered by the grid stack, of the reception area located between a first flank of the grid stack and the first insulating trench is preserved and at least a second exposed portion of the reception area located between a second flank of the grid stack and the second insulating trench is preserved.

In the context of the development of this invention, it has been observed that in practice the performance, particularly in terms of reliability, of transistors produced by prior art methods is very often lower than that which would have been expected by digital simulation, for example.

The present invention makes it possible to reduce or even avoid the deterioration of transistor reliability. For this reason, the invention provides for the removal of the covering and thus the interface between the grid stack and the insulating trenches, and more generally the covering by the grid stack of an interface between two materials of different natures.

Indeed, in the context of the development of the present invention it has been observed that, unexpectedly, many structural anomalies are likely to occur at the level of the active layer/insulating trench interface or more generally at any interface between two materials of different nature.

Thus, according to FIG. 1a illustrating a step of thinning an active layer using a prior art method, it has been observed that a step of simultaneous etching of the active layer and part of the insulating trenches surrounding it leads to the formation of structural anomalies.

In this case, structural anomalies at the active layer/insulating trench interface following their simultaneous engraving have been identified. These anomalies generate "gutter" or "peak" or "beak" shapes.

It should be noted that according to FIG. 1b, which is an electron microscope image, some engravings of the active layer, here in silicon, and part of an insulating trench, here in silicon oxide, cause a peak to form.

After several studies and numerical simulations carried out as part of the development of this invention, it has been identified that this peak originates from the difference in the etching rate of the active layer and the insulating trench. Since these two zones have different crystal structures and compositions, there is a difference in etching speed when they are etched simultaneously. This peak can occur when the active layer is etched faster than the insulating trench.

This difference in etching speed can thus cause the formation of a material peak at the active layer/insulating trench interface leading to transistor reliability problems mainly due to a local weakness of the grid stack and in particular of the grid oxide if it is formed above the peak or more generally in contact with the peak. Indeed, it was identified during the development of this invention that these structural abnormalities lead to local disturbances of the electric field that can be described as a "peak effect". These disturbances lead, among other things, to poor control of electrical performance and deterioration of transistor reliability.

In particular, it has been observed that this peak effect may explain the presence of a strong electric field locally located at the structural abnormality(ies) and which then leads to a breakdown of the grid oxide at a lower voltage than expected. This degradation of the breakdown voltage then leads to a reduction in the lifetime of the transistor.

According to FIG. 1c, which is an electron microscope image, a faster rate of etching of the insulating trench relative to the active layer can result in sometimes complete removal of the insulating trench and thus the formation of a structural abnormality at the thinned active layer/BOX interface. As previously, this structural abnormality leads to transistor reliability problems mainly due to a local weakness of the grid stack and in particular of the grid oxide if it is formed in contact with this structural abnormality.

It should also be noted that according to the etching method presented in FIGS. 2a and 2b, another type of discontinuity may occur and affect the reliability of the transistor. Indeed, these figures represent a step of thinning an active layer by forming a sacrificial oxide layer on its surface. In this prior art method, the entire thickness of some of the insulating trenches can be removed when the sacrificial oxide layer is removed, mainly due to the high thickness of the sacrificial oxide layer to be removed, leading to exposure of the BOX and structural abnormalities at the thinned active layer/BOX interfaces.

Thus, FIGS. 2c and 2d, which are also electron microscope images, present this step of removing the sacrificial oxide layer and exposing the BOX. This method leads to the formation of structural abnormalities which weaken the grid oxide and thus reduce the reliability and performance of the transistors.

Similarly, in the case of the method illustrated in FIGS. 3a to 3d which includes a step of forming a sacrificial oxide layer at the surface of an active layer and in particular at the interface with a hard mask disposed above the active layer/insulating trench interface, structural discontinuities as shown in FIGS. 3c, 3d and 3e, which is an electron microscope image corresponding to the step illustrated in FIG. 3c, were observed.

Thus, after numerous numerical analyses and simulations carried out as part of the development of this invention, it has been identified that these structural abnormalities lead to a significant reduction in the reliability of transistors, for example by a local disturbance of the electric field leading to a breakdown of the grid oxide.

This invention prevents the structural abnormalities presented here from disrupting transistor performance and reducing reliability.

For this purpose, the present invention includes the formation of the grid stack remotely from the active layer/insulating trench interfaces and more generally from topographical or structural discontinuities, i. e. structural abnormalities.

In addition, in the context of the present invention, this conformation of the grid stack and its positioning at a distance from the active layer/insulating trench interfaces is associated with at least one step of masking the portions of the active layer located between the grid stack and the insulating trench(s) in order to maintain electronic neutrality, for example of this area after the formation of the source area and the drain area, and more generally in order to protect this area during the various steps of transistor manufacture.

Thus, the present invention proposes a simple and effective solution to improve the reliability of transistors. Moreover, this solution is easily reproducible and does not significantly increase, or even in any way increase, production costs compared to prior art solutions.

Indeed, alternative solutions that were considered in the development of the present invention would have consisted either in using a substrate with a very thin active layer, or in alternating oxidation and removal cycles of the oxidized layers a large number of times, or in accepting a less significant thinning of the active layer. All these solutions lead to either very high production costs or a high complexity of implementation, or even strong limitations in terms of transistor performance.

Thus, the invention improves the reliability of transistors by softening the topography on areas considered critical for transistor reliability, while maintaining the performance made possible by the differentiated thinning of the active layer. This differentiated thinning can, for example, allow the formation of transistors in reception areas where the active layers have different thicknesses. Thus the invention-based method is particularly advantageous for forming FDSOI and PDSOI transistors on the same wafer.

Another aspect of the present invention concerns a method for making transistors with channels of different thicknesses from the same stack of layers comprising at least one insulating layer topped with at least one active layer of semiconductor material and at least first and second insulating trenches passing through the active layer to define in the active layer a reception area for receiving each transistor, wherein only some of the transistors are formed by the method according to the present invention, so that a plurality of transistors in the stack have channels of which thicknesses are different from the thicknesses of the channels of the other transistors in the stack.

The invention is particularly advantageous for forming transistors on the same wafer with different channel thicknesses. This will allow FDSOI and PDSOI transistors to be formed. For example, the PDSOI transistor channel thickness corresponds to the initial thickness of the active layer of the SOI stack and the FDSOI transistor channel thickness is obtained by thinning the initial thickness of the active layer of the SOI stack.

BRIEF DESCRIPTION OF THE FIGURES

The purposes, objects, characteristics and advantages of the invention will be more readily apparent from the detailed description of the embodiments of the invention, which are illustrated by the following accompanying drawings in which:

FIGS. 11b and 11c represent a view according to sections A-A and B-B respectively in FIG. 11a.

Figure 1A:
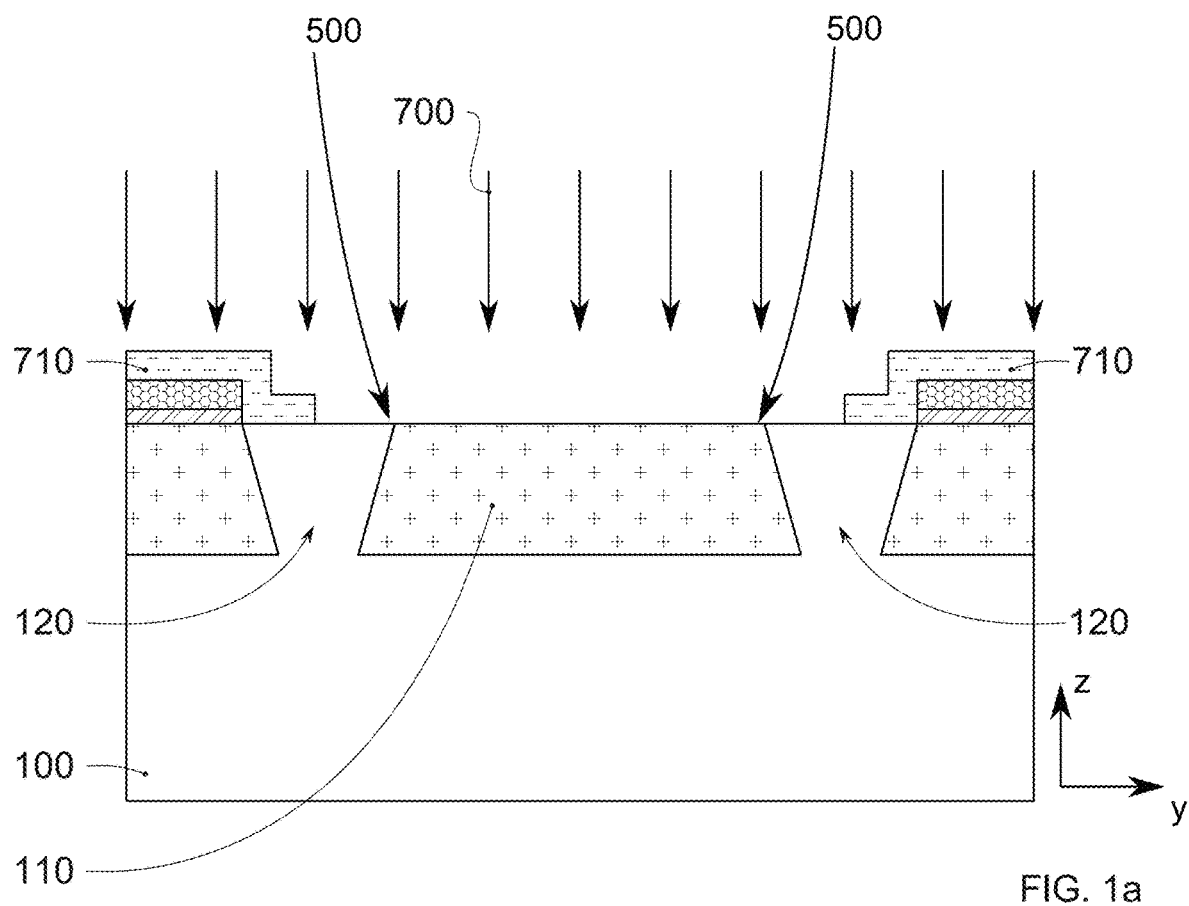
FIGS. 1a, 1b and 1c illustrate a method of thinning an active layer according to the prior art as well as the structural abnormalities induced by it, identified during the development of the present invention.
Figure 1B:
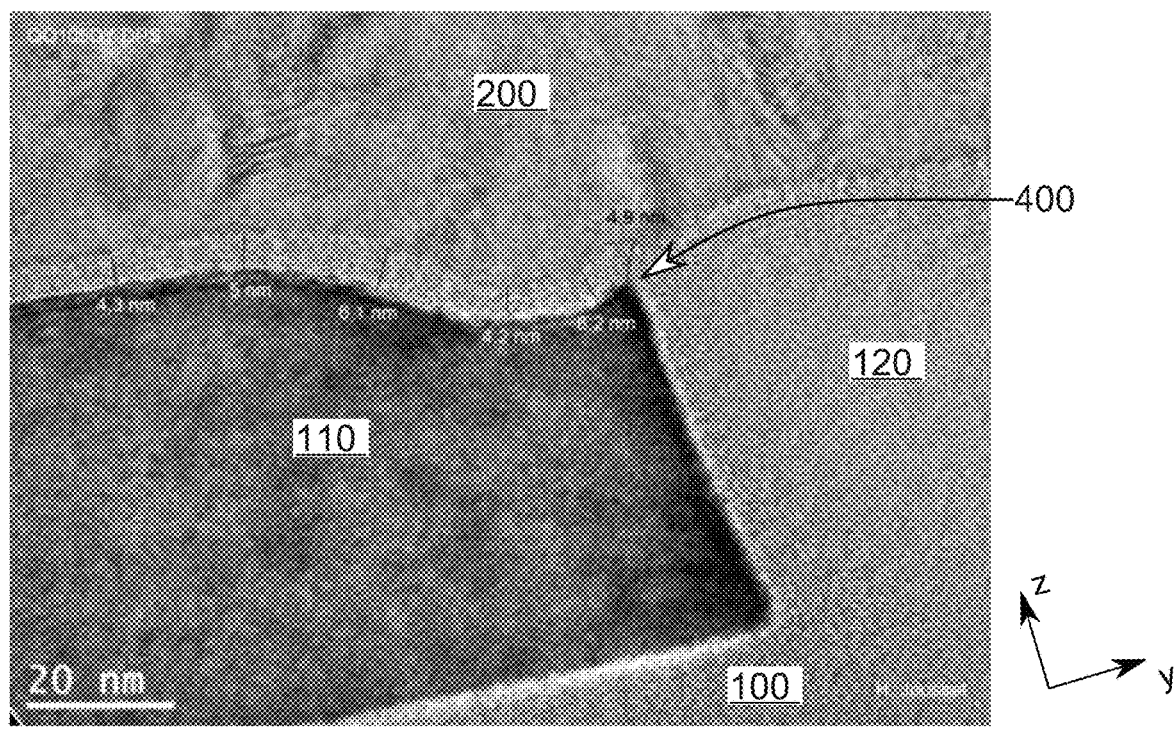
Figure 1C:
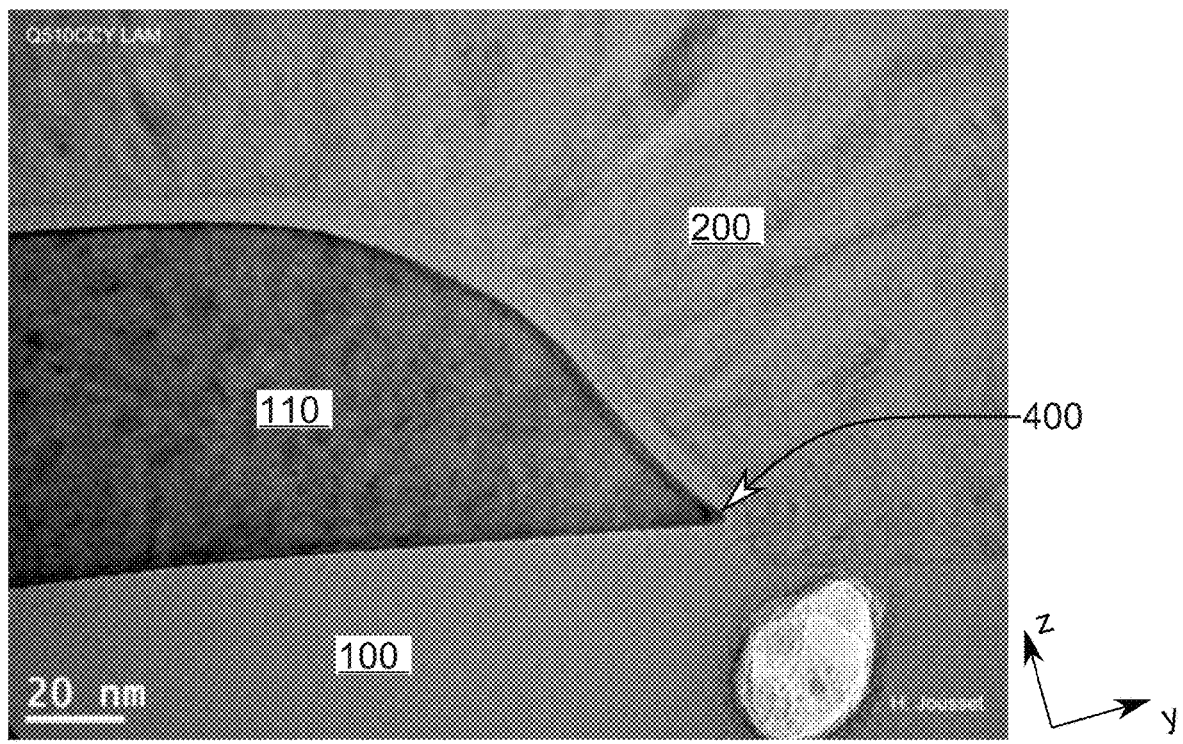
Figure 2A:
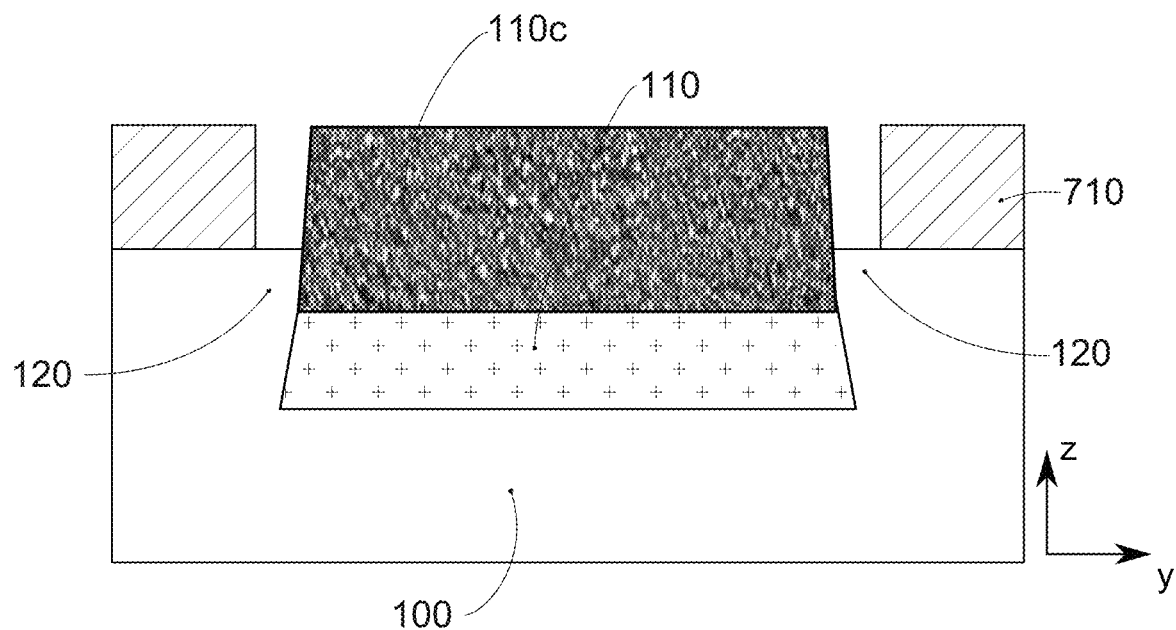
FIGS. 2a to 2d illustrate the steps of another method of thinning an active layer according to the prior art as well as the structural abnormalities induced by it.
Figure 2B:
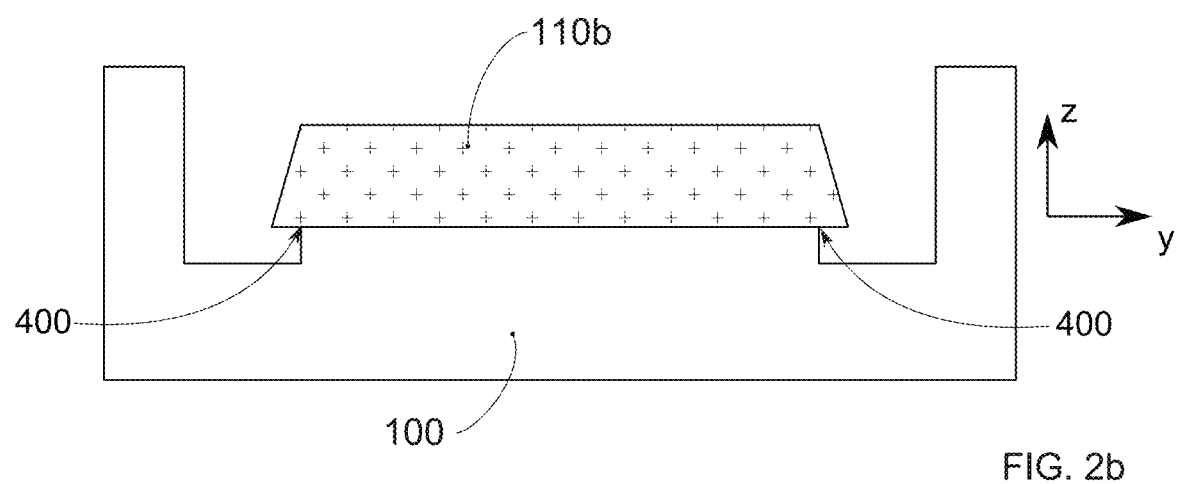
Figure 2C:
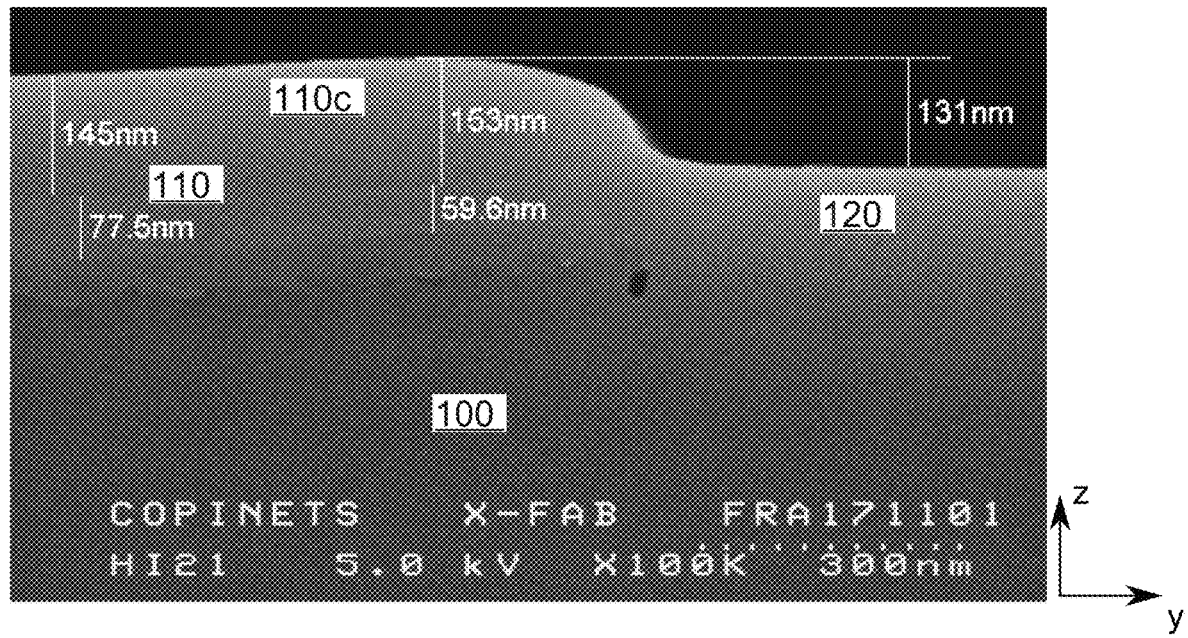
Figure 2D:
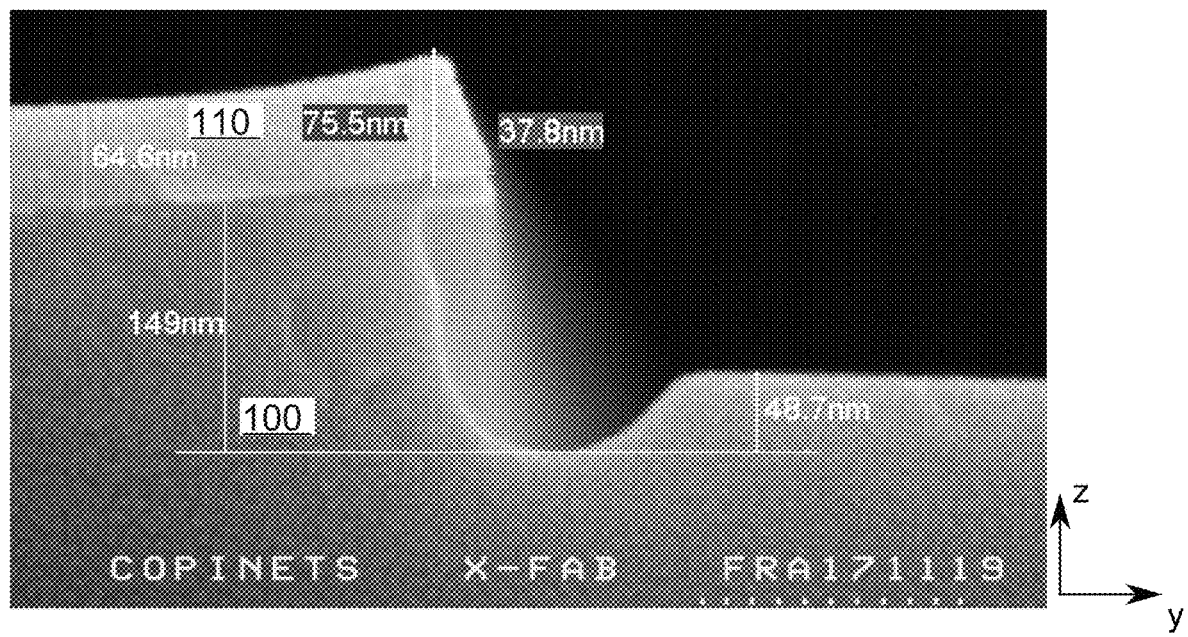
Figure 3A:
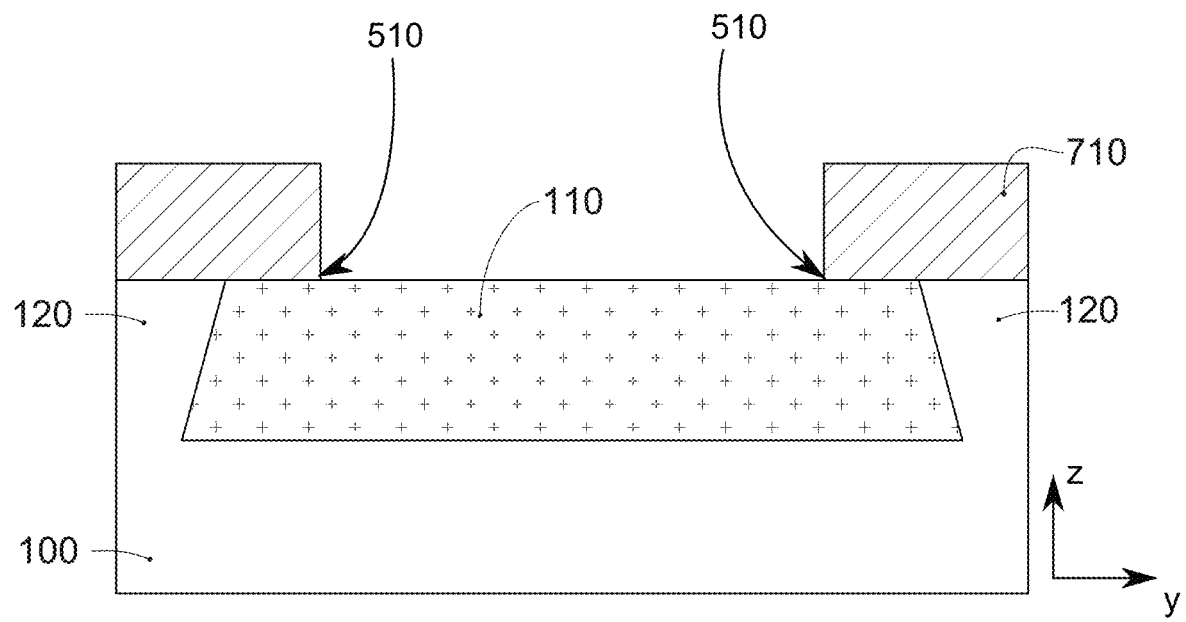
FIGS. 3a to 3e illustrate the steps of another method of thinning an active layer according to the prior art as well as the structural abnormalities induced by it.
Figure 3B:
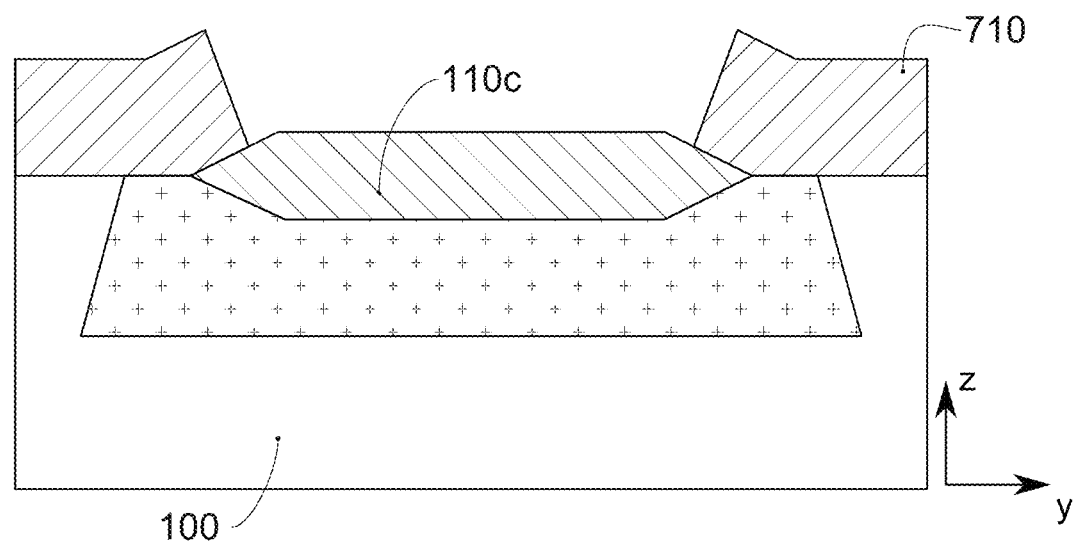
Figure 3C:
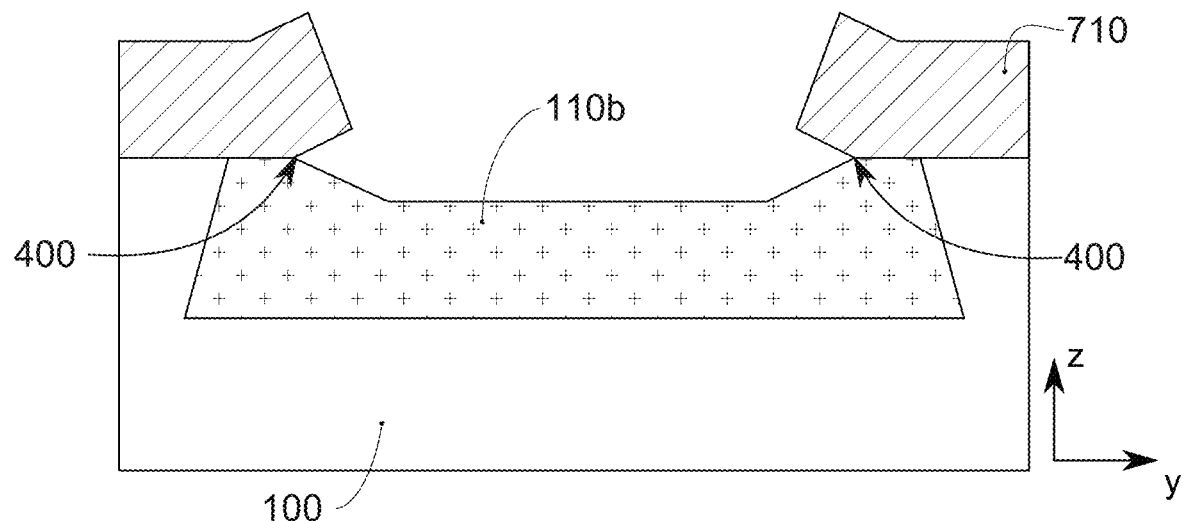
Figure 3D:
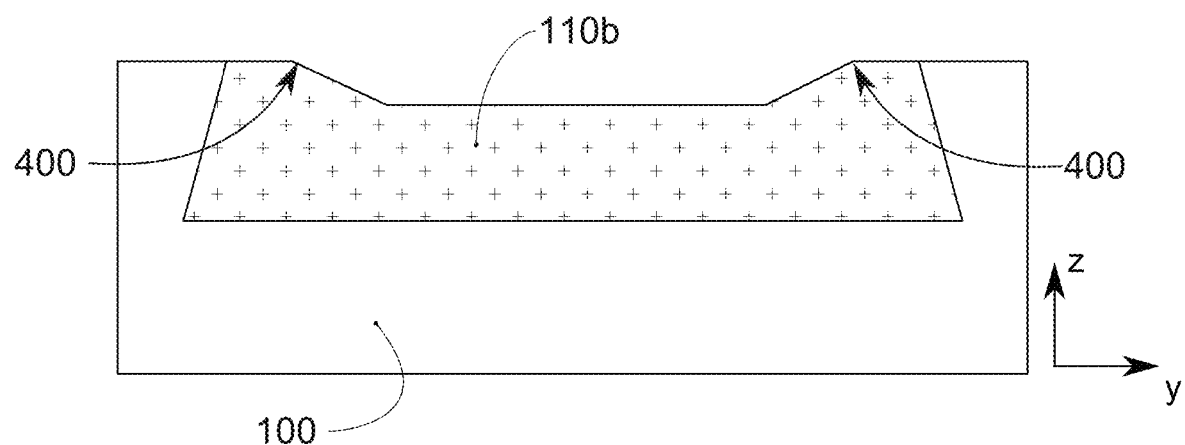
Figure 3E:
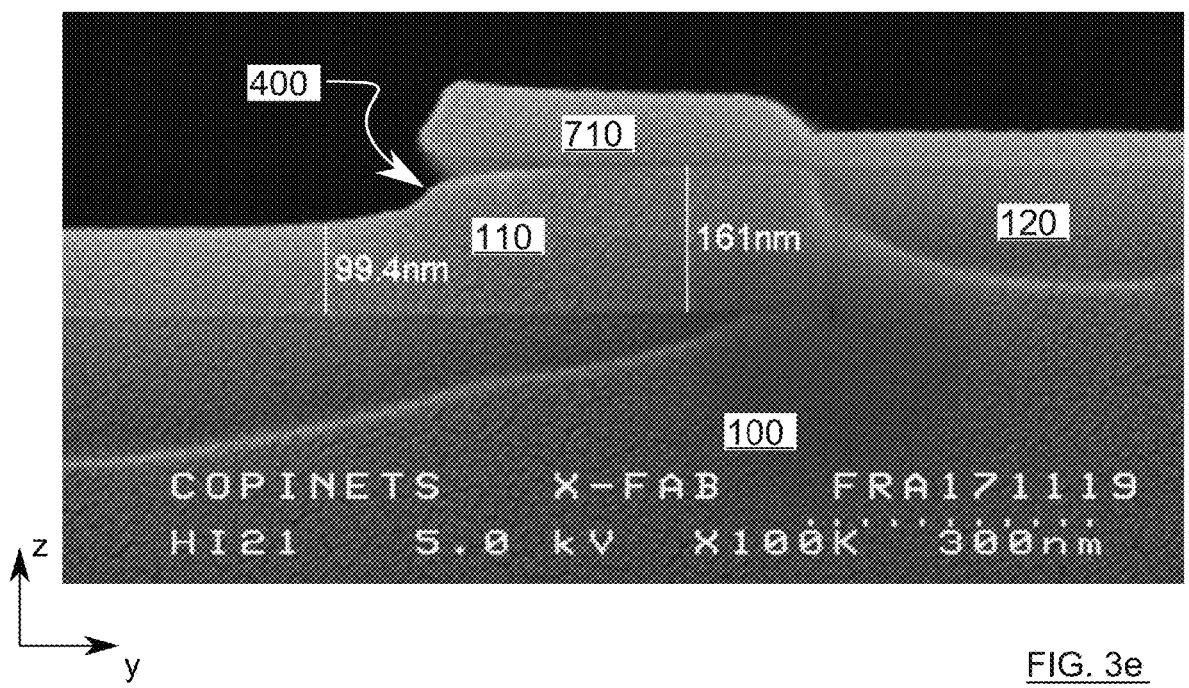

The attached drawings are given as examples and are not limiting the invention. These drawings are schematic representations and are not necessarily on the scale of the practical application. In particular, the transverse and longitudinal dimensions, as well as the relative thicknesses of the different layers, are not representative of actual dimensions.

DETAILED DESCRIPTION OF THE INVENTION

A PDSOI transistor or more generally a PDSOI device is a device built in an area of the active layer the thickness of which is greater than the maximum depletion layer $W_{d\_max}$ (excluding polarization).

By FDSOI transistor or more generally an FDSOI device, we mean a device built in an area of the active layer, the thickness of which is lower than the maximum depletion layer $W_{d\_max}$ (excluding polarization).

The thickness of this maximum depletion layer $W_{d\_max}$ is given by the equation:

$$W_{d\_max}=(2\varepsilon_{si}\varepsilon_0 2\varphi_F/qN_A)^{1/2}$$

With:
$\varepsilon_{si}$: the relative dielectric constant of silicon;
$\varepsilon_0$: the absolute dielectric constant of vacuum;
$\varphi_F=(kT/q)\ln(N_A/n_i)$;
k: Boltzmann constant;
T: temperature;
$n_i$: the intrinsic concentration of silicon carriers;
q: the elementary electrical charge;
$N_A$: the concentration of impurities.
This, at room temperature (300 K), gives $\varphi_F$=0.0259 $\ln(N_A/1.5\times10^{10})$ It is specified that in the context of this invention, the term "slice", "substrate" or "chip" or their equivalents are defined as a device that advantageously includes one or more layers of semiconductors and is configured to receive the formation of semiconductor structures, for example of the transistor type.

It is specified that in the context of this invention, the term "SOI substrate", or its equivalents, is defined as a substrate characterized by the presence of a surface layer of monocrystalline semiconductor, monocrystalline silicon for example, resting on a continuous insulating layer of oxide, for example silicon oxide, known as buried oxide or BOX. The solidity and mechanical rigidity of the assembly are ensured by a support layer made of silicon, for example.

It is specified that, in the context of this invention, the terms "on", "overcomes" or "underlying" or their equivalent do not necessarily mean "in contact with". Thus, for example, the formation of a first layer on a second layer does not necessarily mean that the two layers are in direct contact with each other, but it does mean that the first layer at least partially covers the second layer by being either in direct contact with it or separated from it by another layer or element.

The term "step" does not necessarily mean that the actions carried out during a step are simultaneous or immediately successive. Some actions in a first step may be followed by actions related to a different step, and other actions in the first step may be repeated afterwards. Thus, the term step does not necessarily mean unitary and inseparable actions in time and in the sequence of method phases.

By "structure" of a material is meant the spatial distribution of its elementary constituents from a crystallographic point of view. Thus, two layers of the same material may be of the same nature, but have different crystalline structures.

The "nature" of a material refers to its chemical composition and/or crystal structure. Thus two layers can be of the same chemical composition, but of a different nature from a crystallographic point of view.

In this patent application, a structural abnormality is, for example, a discontinuity or structural irregularity, preferably topographic or crystallographic or stoichiometric. In the case of a structural abnormality of a topographical nature, it can only be present on the surface. In the case of a structural abnormality of a crystallographic or stoichiometric nature, it may have a volume dimension in the substrate or even not be visible at the surface.

It should be noted that these structural abnormalities are mainly located at the interfaces between two materials of different natures, and can be accentuated by engraving these materials at their interface.

In the following description, thicknesses are generally measured in directions perpendicular to the plane of the underside of the supporting substrate on which the active layer is placed. Thus, thicknesses are generally taken in the z direction of the orthogonal reference mark present in the figures in this description.

A "transversal" dimension is any dimension measured in the direction x on the orthogonal reference mark shown in the figures. Thus, according to all the figures except FIG. 5$b$, the transverse dimension corresponds to a direction of the conduction channel extending between the source and drain zones, i.e. also according to the main direction of the load carriers' path from the source zone to the drain zone. Nevertheless, according to the particular embodiment illustrated in FIG. 5$b$, the path of the load carriers is in the y direction but the transverse dimension remains measured in the x direction on the orthogonal reference mark for this figure and the associated embodiment.

A "longitudinal" dimension is any dimension measured in a direction y perpendicular to the transverse direction of the grid stack taken in the x direction. The transverse dimension of the grid stack is generally, but not necessarily, smaller than its longitudinal dimension.

In particular, and with reference to the orthogonal markers shown in the figures, the longitudinal dimensions are measured in the longitudinal direction y and the transverse dimensions in the transverse direction x.

Before starting a detailed review of the embodiments of the invention, the following are optional characteristics that may be used in combination or alternatively:

According to an embodiment, the step of defining said conduction channel may include a step of removing at least a part of the active layer at the reception area so as to form a thinned active layer preferably defining a thinned reception area.

According to an embodiment, said thinning step is carried out so as to form a thinned active layer and the thinning step comprises at least one dry and/or wet etching of at least a part of the active layer at the reception area.

According to an embodiment, said thinning step is performed so as to form a thinned active layer and the thinning step comprises at least the formation of a sacrificial oxide layer by at least one oxidation of at least a part of the active layer followed by the removal of at least a part of said sacrificial oxide layer.

According to an embodiment, the thickening step includes at least the formation of an epitaxial layer, preferably by epitaxial growth.

Preferably the epitaxial layer contains at least one semiconductor material.

According to an embodiment, the method includes the step of thinning and the step of thickening a part of the active layer, each of these two steps can be performed one after the other and potentially a plurality of times.

According to an embodiment, the step of defining said conduction channel may include a step of epitaxial growth of at least one crystalline material, preferably semiconductor, in the reception area.

In a particularly advantageous way, the invention avoids the appearance of structural abnormalities. With prior art methods, the positioning of the grid stack in contact with these structural abnormalities leads to a decrease in transistor reliability.

Thus, the definition of said conduction channel at the reception area includes said step of thickening the active layer.

According to an embodiment, the method comprises, after said step of thickening the active layer, a step of forming at least one spacer around at least a part of said thickened reception area.—

Advantageously, the formation of the grid stack is carried out in such a way that the first and second portions of the reception area, not covered by said grid stack, each extend from one side of the grid stack and to said spacer so that the first and second portions are located on either side of said grid stack in said longitudinal direction (y).

Advantageously, the first and second insulating trenches can form a single insulating trench surrounding said reception area.

Advantageously, steps a), b) and c) are carried out successively.

Advantageously, the first and second portions have dimensions L111 and L112, respectively, measured in the longitudinal direction y, these dimensions are such that:

L111≥k2*L200 and L112≥k2*L200 with k2≥0.05, preferably k2≥0.1, and L200 being the longitudinal dimension of the grid stack.

These values make it possible to effectively isolate the source and drain areas while avoiding the defects mentioned above at the interfaces between the insulating trenches and the active layer forming the conduction channel, for example.

For example, the step of forming a source and drain zone includes either a doping of the active layer, or a deposition by epitaxy from the active layer, or a deposition by epitaxy from the active layer and a doping. In all these cases, it is necessary to mask the first and second portions when forming the source and drain areas.

Advantageously, the first and second portions have dimensions L111 and L112, respectively, measured in the longitudinal direction y, these dimensions are such that:

L200≥k1*L111 and L200≥k1*L112 with k1≥2 and L200 being the dimension of the grid stack measured in the longitudinal direction y, preferably k1≥3.

Advantageously, said first step of masking the first and second exposed portions comprises positioning at least one mask on top of the first and second exposed portions, said at least one mask having dimensions and being positioned so as to mask:

the first and second portions exposed in their entirety, parts of the grid stack adjacent to the first and second exposed portions and/or parts of the first and/or second insulating trenches adjacent to the first and/or second exposed portions.

Thus, the mask(s) effectively mask the parts of the grid stack and/or the parts of the insulating trenches that are in direct contact with the first and second exposed portions.

Advantageously, the present invention comprises at least one step of forming at least one electrically conductive zone with the conduction channel, said step of forming at least one electrically conductive zone with the conduction channel comprising positioning at least one mask on top of the first and second portions so as to mask the first and second portions during said step of forming at least one electrically conductive zone with the conduction channel, said at least one mask having dimensions and being positioned so as to mask:

entirely the first and second portions, parts of the grid stack adjacent to the first and second portions and/or parts of the first and/or second insulating trenches adjacent to the first and/or second exposed portions.

Thus, the mask(s) effectively mask the parts of the grid stack and/or the parts of the insulating trenches that are in direct contact with the first and second exposed portions.

Advantageously, the present invention comprises at least one step of forming at least one electrical contact zone, said step of forming at least one electrical contact zone comprising positioning at least one mask on top of the first and second portions so as to mask the first and second portions during said step of forming at least one electrical contact zone, said at least one mask having dimensions and being positioned so as to mask:

entirely the first and second portions, parts of the grid stack adjacent to the first and second portions and/or parts of the first and/or second insulating trenches adjacent to the first and/or second portions.

Thus, the mask(s) effectively mask the parts of the grid stack and/or the parts of the insulating trenches that are in direct contact with the first and second exposed portions.

Advantageously, the first step of masking the first and second exposed portions of the reception area includes at least the following steps:

a) Conforming a first mask having a polygonal shape including a first geometric centre;

b) Positioning said first mask at said first exposed portion of the reception area so that said first geometric centre is located just above the geometric centre of said first exposed portion;

c) Conforming a second mask having a polygonal shape including a second geometric centre;

d) Positioning said second mask at said second exposed portion of the reception area so that said second geometric centre is located just above the geometric centre of said second exposed portion;

In a particularly advantageous way, the present invention defines one or more masks whose spatial dimensions have a safety margin, for example during the doping formation of the source and drain zones, guaranteeing the non-doping of the first and second exposed portions.

Advantageously, the first mask extends from the first geometric centre over a distance between 10 nm and 1200 nm, preferably between 50 nm and 800 nm and advantageously equal to 600 nm, and the second mask extends from the second geometric centre over a distance between 10 nm and 1200 nm, preferably between 50 nm and 800 nm and advantageously equal to 600 nm.

In a particularly advantageous way, the present invention defines one or more masks whose spatial dimensions have a safety margin, for example during the doping formation of the source and drain zones, guaranteeing the non-doping of the first and second exposed portions.

Advantageously, the conforming and positioning of the first mask is configured so that said first mask is located just above said exposed first portion of the reception area, at least a portion of said grid stack and at least a portion of the first insulating trench, and the conformation and positioning of the second mask is configured so that said second mask is located just above said exposed second portion of the reception area, at least a portion of said grid stack and at least a portion of the second insulating trench.

In a particularly advantageous way, the present invention defines one or more masks with spatial dimensions adapted to the protection of at least part of the grid stack, exposed portions of the active layer and part of the insulating trenches. This allows a safety margin, for example, during doping formation of the source and drain areas, ensuring that the first and second exposed portions are not doped.

Advantageously, the first and second masks are included in a single shaped mask for the step of forming the source and drain zone.

This allows, by simply modifying a mask already commonly used for the formation of source and drain zones, to implement the present invention without adding an additional mask.

Advantageously, the insulating trenches extend mainly in a plane perpendicular to the main plane in which the active layer extends.

According to an embodiment, the formation of the source zone and the drain zone is carried out by doping the active layer.

According to another embodiment, the formation of the source zone and the drain zone is carried out by epitaxy from the active layer. This results in raised source and drain areas relative to the upper surface of the active layer. According to this method, masking the first and second portions at the ends of the grid prevents epitaxial growth from these portions of the active layer.

Advantageously, the method according to the present invention includes at least one step of forming at least one electrically conductive zone with the conduction channel, for example by doping a part of the reception zone, preferably according to the first polarity.

This allows, for example, the formation of a "body contact", i. e. an area electrically connected to the conduction channel and whose electrical potential may or may not be independent from that of the source zone and/or the drain zone. This allows the electrical potential of a portion of the conduction channel to be controlled.

Advantageously, the step of forming at least one electrically conductive zone with the conduction channel comprises a second step of masking said first and second exposed portions of the reception zone so that the first and second exposed portions of the reception zone are masked when forming the electrically conductive zone with the conduction channel.

This protects the first and second exposed portions when forming the electrically conductive zone with the conduction channel.

Advantageously, the second step of masking said first and second exposed portions of the reception area includes at least the following steps:
a) Positioning said third mask at said first exposed portion of the reception area so that said third centre is located just above the geometric centre of said first exposed portion;
b) Positioning said fourth mask at said second exposed portion of the reception area so that said fourth centre is located just above the geometric centre of said second exposed portion.

Advantageously, the second step of masking said first and second exposed portions of the reception area includes at least the following steps:
a) Conforming a third mask having a polygonal shape including a third geometric centre;
b) Positioning said third mask at said first exposed portion of the reception area so that said third geometric centre is located just above the geometric centre of said first exposed portion;
c) Conforming a fourth mask having a polygonal shape including a fourth geometric centre;
d) Positioning said fourth mask at said second exposed portion of the reception area so that said fourth geometric centre is located on top of the geometric centre of said second exposed portion.

In a particularly advantageous way, the present invention defines one or more masks whose spatial dimensions have a safety margin, for example during the formation by doping of the electrically conductive zone with the conduction channel, guaranteeing the non-doping of the first and second exposed portions.

Advantageously, the third mask extends from the third geometric centre over a distance between 10 nm and 1200 nm, preferably between 50 nm and 800 nm and advantageously equal to 600 nm, and the fourth mask extends from the fourth geometric centre over a distance between 10 nm and 1200 nm, preferably between 50 nm and 800 nm and advantageously equal to 600 nm.

In a particularly advantageous way, the present invention defines one or more masks whose spatial dimensions have a safety margin, for example during the doping formation of the source and drain zones, guaranteeing the non-doping of the first and second exposed portions.

Advantageously, the conforming and positioning of the third mask is configured so that said third mask is located on top of said first exposed portion of the reception area, at least a portion of said grid stack and at least a portion of the first insulating trench, and the conforming and positioning of the fourth mask is configured so that said fourth mask is located on top of said second exposed portion of the reception area, at least a portion of said grid stack and at least a portion of the second insulating trench.

In a particularly advantageous way, the present invention defines one or more masks with spatial dimensions adapted to the protection of at least part of the grid stack, exposed portions of the active layer and part of the insulating trenches. This allows a safety margin, for example, during the formation by doping of the electrically conductive area with the conduction channel, ensuring that the first and second exposed portions are non-doped.

Advantageously, the third and fourth masks are included in a single shaped mask for the step of forming said electrically conductive area with the conduction channel.

This makes it possible, by simply modifying a mask already commonly used for the formation of the electrically conductive zone(s) with the conduction channel, to implement the present invention without adding an additional mask.

Advantageously, the method according to the present invention includes at least one step of forming at least one electrical contact zone, preferably by depositing at least one metal layer followed by silicidation of a part of said metal layer.

Advantageously, the step of forming at least one electrical contact area includes a third step of masking said first and second exposed portions of the reception area so that the first and second exposed portions of the reception area are not exposed when forming the electrical contact area.

Advantageously, the third step of masking said first and second exposed portions of the reception area includes at least the following steps:
a) Positioning said fifth mask at said first exposed portion of the reception area so that said fifth centre is located on top of the geometric centre of said first exposed portion;
b) Positioning said sixth mask at said second exposed portion of the reception area so that said sixth centre is located on top of the geometric centre of said second exposed portion;

Advantageously, the third step of masking said first and second exposed portions of the reception area includes at least the following steps:
a) Conforming a fifth mask having a polygonal shape including a fifth geometric centre;
b) Positioning said fifth mask at said first exposed portion of the reception area so that said fifth geometric centre is located on top of the geometric centre of said first exposed portion;
c) Conforming a sixth mask having a polygonal shape including a sixth geometric centre;
d) Positioning said sixth mask at said second exposed portion of the reception area so that said sixth geometric centre is located on top of the geometric centre of said second exposed portion.

In a particularly advantageous way, the present invention defines one or more masks whose spatial dimensions have a safety margin, for example during the formation by silicidation of the electrical contact zone, guaranteeing the non-silicidation of the first and second exposed portions.

Advantageously, the fifth mask extends from the fifth geometric centre over a distance between 10 nm and 1200 nm, preferably between 50 nm and 800 nm and advantageously equal to 600 nm, and the sixth mask extends from the sixth geometric centre over a distance between 10 nm and 1200 nm, preferably between 50 nm and 800 nm and advantageously equal to 600 nm.

In a particularly advantageous way, the present invention defines one or more masks whose spatial dimensions have a safety margin, for example during the formation by doping of the source and drain zones, guaranteeing the non-doping of the first and second exposed portions.

Advantageously, conforming and positioning of the fifth mask is configured so that said fifth mask is located on top of said first exposed portion of the reception area, at least a portion of said grid stack and at least a portion of the first insulating trench, and the conforming and positioning of the sixth mask is configured so that said sixth mask is located on top of said second exposed portion of the reception area, at least a portion of said grid stack and at least a portion of the second insulating trench.

In a particularly advantageous way, the present invention defines one or more masks with spatial dimensions adapted to the protection of at least part of the grid stack, exposed portions of the active layer and part of the insulating trenches. This allows a safety margin, for example during the formation by silicidation of the electrical contact zone, guaranteeing that the first and second exposed portions are not silicidated.

Advantageously, the fifth and sixth masks form a single shaped mask for the step of forming said electrical contact area.

This makes it possible, by simply modifying a mask already commonly used for the formation of the electrical contact zone(s), to implement the present invention without adding an additional mask.

Advantageously, the first, second and third masking steps of said first and second exposed portions of the reception area form a single masking step.

Advantageously, the definition of said conduction channel at the reception area includes said step of thinning a portion of the active layer at the reception area to form a thinned active layer, the thinning step including at least the formation of a sacrificial oxide layer by oxidation of a portion of the active layer followed by the removal of at least a portion of said sacrificial oxide layer.

Advantageously, the present invention comprises at least one step of forming at least one electrical contact zone, said step of forming at least one electrical contact zone comprising a third step of masking said first and second portions of the reception zone so that the first and second portions of the reception zone are not exposed when the electrical contact zone is formed.

Advantageously, the present invention comprises at least one step of forming at least one electrically conductive zone with the conduction channel, said step of forming at least one electrically conductive zone with the conduction channel comprising a second step of masking said first and said second portions of the reception zone so that the first and second portions of the reception zone are masked when forming the electrically conductive zone with the conduction channel.

Figure 4:
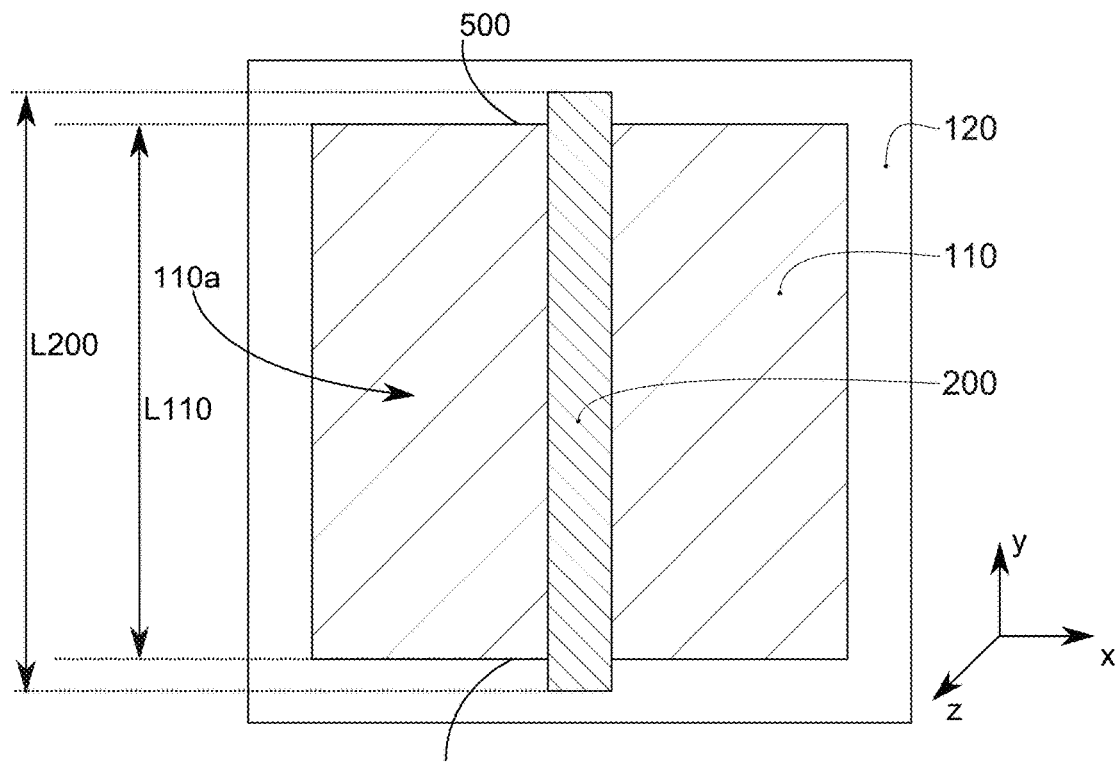
FIG. 4 shows a top view of a microelectronic device according to the previous art in which the grid stack extends on either side of an active layer surrounded by an insulating trench.

FIG. 4 shows the positioning of a grid stack 200 above a conduction channel according to the prior art. In this figure, an active layer 110 is surrounded by an insulating trench 120 so as to define a reception area 110a.

In this figure, and as a non-limiting example, the insulating trench 120 defines a closed perimeter within which is located the reception area 110a.

In this figure, it is noted that the grid stack 200 extends on either side of the active layer/insulating trench 500 interfaces. In particular, the grid stack 200 has a longitudinal dimension L200 in the y direction greater than the longitudinal dimension L110 of the reception area 110a in the y direction.

As previously indicated, this positioning of the grid stack 200 with respect to the reception area 110a and the insulating trench 120 leads to transistor performance problems with respect to the reliability of the grid stack 200 due to the structural abnormalities presented above. Indeed, it was identified during the development of this invention that structural abnormalities 400 can lead either to an irregular growth of grid oxide 203, potentially locally finer, or to a peak effect and therefore a strong local electric field that causes a breakdown of grid oxide 203 at a lower voltage than that estimated for the transistor under consideration.

Figure 5A:
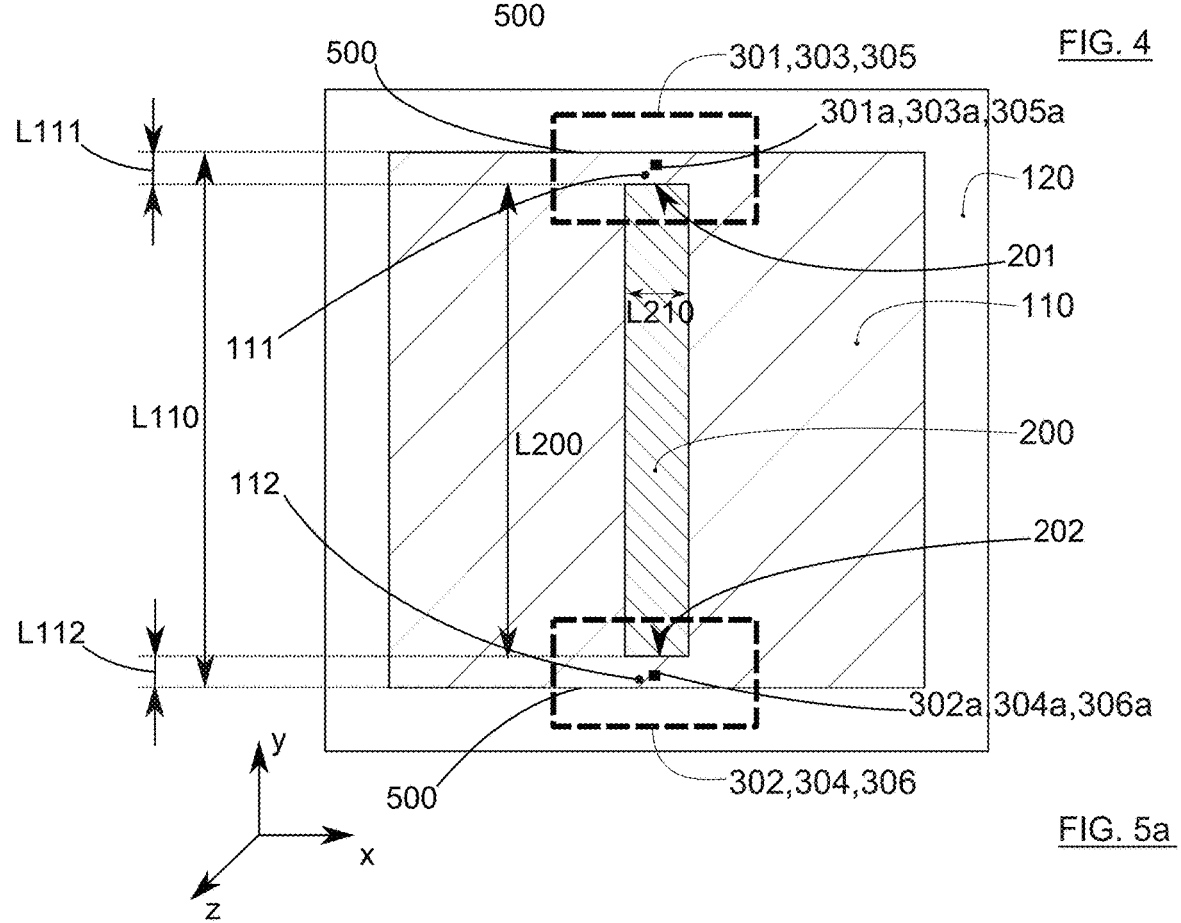
FIGS. 5a and 5b represent, according to two embodiments of the present invention, a top view of two microelectronic devices.

FIG. 5a shows the positioning of a grid stack 200 according to an embodiment of this invention. It should be noted in particular that according to the present invention, the grid stack 200 is arranged in such a way that it does not extend on either side of the active layer/insulating trench 500 interfaces.

This grid stack 200 can thus be described by indicating that its longitudinal dimension L200, in the y direction, is smaller than the longitudinal dimension L110 of the reception area 110a delimited by an insulating trench 120 in this figure.

According to the present invention, the grid stack 200 is arranged above the conduction channel of the transistor to be formed, preferably so as to cover the entire conduction channel.

Preferably, the grid stack 200 is placed in contact with the conduction channel.

The conduction channel is preferably made of silicon, silicon-germanium or germanium. It is preferably based on an insulating layer, for example a silicon oxide layer (for example SiO2 or more generally SixOy, x and y being integers) forming the BOX 100. This insulating layer itself rests on a support substrate, for example amorphous or polycrystalline silicon.

For the sake of brevity and clarity, in the following description the terms "grid" or "grid stacking" shall mean a single-layer grid or a grid formed by a plurality of layers. In the latter case, the grid stack 200 can include in particular:

a grid pattern usually made of silicon, for example polycrystalline silicon, a metal layer between the grid pattern and the active layer 110, an electrically insulating layer called grid oxide 203 located between the active layer 110 and the polycrystalline silicon grid pattern.

Optionally, the grid stack can also include a dielectric layer called "high-k", i.e. made of a high permittivity material. When present, this dielectric layer is located between grid oxide 203 and the metal grid.

According to the present invention, the grid stack 200 can be formed by growth and/or by deposition of material layers.

In the figures of this description, for reasons of clarity and brevity, grid 200, whether formed of a single layer or a plurality of layers, is represented by a layer referenced 200 of polycrystalline type. It should also be noted that for clarity reasons, the grid oxide layer 203 has also been represented.

In FIG. 5a, the grid stack 200 is arranged to provide a first 111 and a second 112 portion of the reception area 110a not covered by the grid stack 200. These first and second portions 111 and 112, also known as the first and second exposed portions respectively, each extend advantageously from one of the flanks 201, 202 of the grid stack 200 to the insulating trench 120 surrounding the reception area 110 on FIG. 5a.

Particularly advantageously, these first and second portions 111 and 112 are located on either side of the grid stack 200 in the longitudinal direction y.

Preferably, but not exclusively, the areas on either side of the grid stack 200 in the transverse direction x correspond at least in part to the source zones 2 and drain zones 3 to be formed.

Thus, the "first flank of the grid stack" is referred to as the first flank 201 of the grid stack 200 from which the first portion 111 extends towards the insulating trench 120 in the y direction and "the second flank of the grid stack" as the flank 202 of the grid stack 200 from which the second portion 112 extends towards the insulating trench 120 in the y direction.

Thus, the first portion 111 can be defined as a portion of the reception area 110a, or the active layer 110, located between the first flank 201 of the grid stack 200 and the active layer/insulating trench interface 500.

Similarly, the second portion 112 can be defined as a portion of the reception area 110a, or the active layer 110, located between the second flank 202 of the grid stack 200 and the insulating active layer/trench interface 500.

In a clever way, the positioning of the grid stack 200 according to the present invention with respect to the active layer/insulating trench interfaces 500 prevents it from being located at the level of the structural abnormalities 400 previously identified. This then allows the grid stack 200 to present a greater homogeneity at its interface with the active layer 110.

However, since the first 111 and second 112 portions are not covered by the grid stack 200 as opposed to the prior art, at least one mask (301, 302, 303, 304, 305, 306) of the plurality of masks of the transistor manufacturing method should be adapted accordingly.

Thus, according to FIG. 5a, a first plurality of masks 301, 303 and 305 and a second plurality of masks 302, 304 and 306 can be shaped to protect the first 111 and second 112 portions respectively.

Advantageously, and as shown in FIG. 5a, the first plurality 301, 303 and 305 and the second plurality 302, 304 and 306 of masks have a geometric centre 301a, 303a, 305a and 302a, 304a, 306a respectively.

In a clever way, the first plurality 301, 303 and 305 and the second plurality 302, 304 and 306 of masks extend from this geometric centre over a sufficient distance to mask the first 111 and second 112 portions respectively.

Preferably, the extension of the first 301, 303 and 305 and the second 302, 304 and 306 pluralities of masks is sufficient to also mask at least a part of the active layer/insulating trench 500 interfaces, and preferably at least a part of the first 201 and second 202 flanks of the grid stack 200 respectively.

In a particularly clever way, the first 301, 303 and 305 and the second 302, 304 and 306 plurality of masks are respectively arranged so that their geometric centre 301a, 303a, 305a and 302a, 304a, 306a is located on top of the geometric centres of the first 111 and second 112 portions, respectively.

Advantageously, the first 301, 303 and 305 and the second 302, 304 and 306 pluralities of masks have a rectangular shape, preferably so as to extend on either side of the first 111 and the second 112 portions respectively of the reception area 110a over a distance greater than 50 nm, preferably greater than 150 nm and advantageously equal to 200 nm.

This ensures that the first 111 and second 112 portions are protected during the various steps of transistor manufacture.

Considering that the grid stack 200 has a longitudinal dimension L200 in the longitudinal direction y and a transverse dimension L210 in the transverse direction x, then the first portion 111 can have a longitudinal dimension L111 in the direction y and the second portion 112 can have a longitudinal dimension L112 in the direction y.

Thus, L111 is the distance between the first flank 201 and the insulating trench 120, and L112 is the distance between the second flank 202 and the insulating trench 120.

According to a preferred embodiment, L111 is between 10 nm and 2000 nm, preferably between 50 nm and 1500 nm and advantageously equal to 1000 nm.

Similarly, L112 is between 10 nm and 2000 nm, preferably between 50 nm and 1500 nm and advantageously equal to 1000 nm.

Advantageously, the first 111 and second 112 portions of the reception area 110a can have extension dimensions proportional to those of the grid stack 200.

According to one embodiment, the first 111 and second 112 portions have longitudinal dimensions less than or equal to their transverse dimensions.

Advantageously, the ratio between the longitudinal dimension of the first plurality of masks 301, 303 and 305 and L111 is between 0.15 and 0.9, preferably between 0.25 and 0.85 and advantageously equal to 0.5. The ratio between the longitudinal dimension of the second plurality of masks 302, 304 and 306 and L112 is between 0.15 and 0.9, preferably between 0.25 and 0.85 and advantageously equal to 0.5.

Figure 5B:
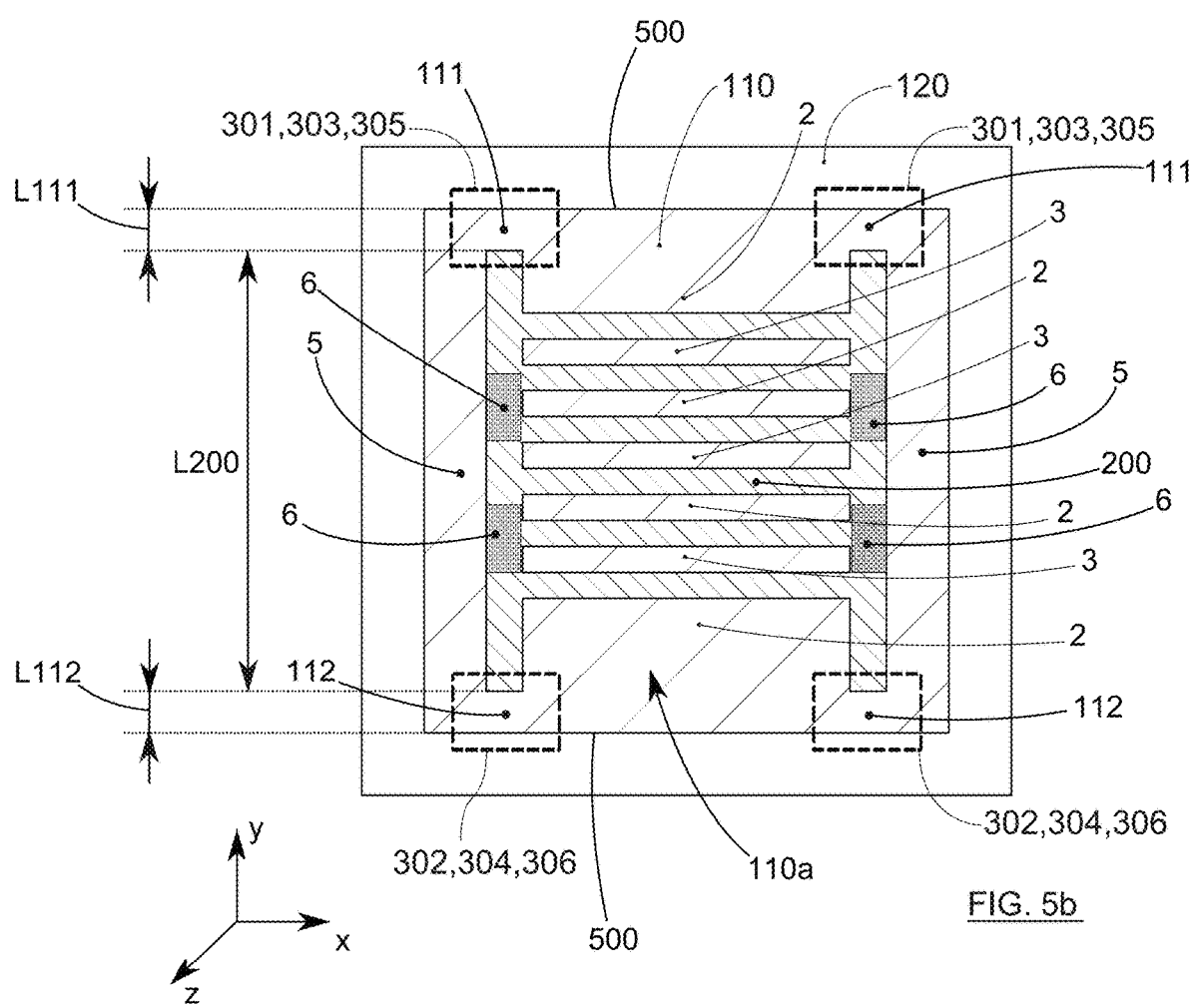

FIG. 5b shows an example of embodiment of this invention in the case of a microelectronic device comprising a plurality of transistors and two electrically conductive zones 5 with the conduction channels. Each transistor includes a source zone 2 and a drain zone 3 on either side of a conduction channel topped by a grid stack 200. In a particularly advantageous way, the configuration of the grid stack 200 makes it possible, according to an embodiment of the present invention, to form a plurality of grid stacks 200 in a single piece. This grid stack 200 is located at a distance from the active layer/insulating trench interface 500 defining two first portions 111 and two second portions 112 of the receiving layer 110a not covered by grid stack 200.

In this figure, the grid stack 200 has a particular geometry comprising two arms extending longitudinally, i.e. in the y direction, and a plurality of fingers extending vertically, i.e. in the x direction.

Fingers are advantageously attached to both arms and connect them to each other.

Each finger is formed above a conduction channel of a transistor.

Preferably, each arm includes at least one electrical contact zone 6. In particular, it should be noted in this figure that each arm includes two electrical contact zones 6 formed on the surface of the grid stack 200. This provides several degrees of freedom in controlling the electrical potential of the transistor grid stack 200.

According to this embodiment, the first portions 111 and the second portions 112 are arranged at the ends of these two arms.

Thus, it should be noted that in this figure, at least two first pluralities and two second pluralities of masks are required given the presence of four portions of the active layer 110 not covered by the grid stack 200. The present invention can thus be generalized to any number of portions similar to the first 111 and second 112 portions previously described.

The present invention thus concerns a method for the manufacture of at least one transistor whose grid stack 200 is arranged at a distance from the active layer/insulating trench interfaces 500 and in which a first 301, 303 and 305 and a second 302, 304 and 306 plurality of masks are used to protect the first 111 and second 112 portions respectively.

More generally, the present invention thus concerns a method for the manufacture of at least one transistor whose grid stack 200 is located at a distance from the interfaces between two materials of a different nature.

It should be noted that according to an embodiment of the method of this invention, several steps require masking the first 111 and second 112 portions of the reception area 110a not covered by the grid stack 200.

For example, when forming source zones 2 and drain zones 3 by doping the active layer 110, a first mask 301 should be placed above the first portion 111 and a second mask 302 above the second portion 112 so that the first 111 and second 112 portions are not doped when doping part of the active layer 110.

Advantageously, the first 301 and second 302 masks can be considered as two parts of a single mask. In this case, the mask commonly used for the formation step of source zone 2 and drain zone 3 can be adapted to integrate these two parts and mask the first 111 and second 112 portions.

Similarly, when forming an electrically conductive zone 5 with the conduction channel, commonly referred to as the "body contact", a third mask 303 should be used to mask the first portion 111 and a fourth mask 304 to mask the second portion 112. Indeed, the formation of an electrically conductive zone 5 with the conduction channel generally includes a step of doping a part of the active layer 110. The masking of the first 111 and second 112 portions is therefore necessary to avoid doping them during this method step.

Again, it should be noted that according to a preferred embodiment, the third 303 and fourth 304 masks can be considered as two parts of a single mask. In this case, the mask commonly used for the step of forming zone(s) 5 in electrical conduction with the conductivity channel(s) can be adapted to integrate these two parts and mask the first 111 and second 112 portions.

Finally, it is common to use a step of forming one or more electrical contact zones 6, mainly to electrically connect source zones 2, drain zone 3, grid stack 200 and electrically conductive zone(s) 5 with the conduction channel. This formation step generally includes a first step of forming a metallic layer 230 for example by depositing a metallic material. This step of forming a metallic layer 230 is followed by a step of silicidation of part of the metallic layer so as to form silicidated zones 240. In order to ensure that there is no short circuit between the different zones considered, a fifth mask 305 should be placed so as to mask the first portion 111 and a sixth mask 306 so as to mask the second portion 112.

As before, it should be noted that according to a preferred embodiment, the fifth 305 and sixth 306 masks can be considered as two parts of a single mask. In this case, the mask commonly used for the formation step of electrical contact zone(s) 6 can be adapted to integrate these two parts and mask the first 111 and second 112 portions.

We will now illustrate some of the advantages of the present invention by comparing cases of the prior art with embodiments of the present invention.

FIGS. 6a, 7a, 8a and 9a represent cross-sectional views of a microelectronic device that was not made according to this invention. In these figures, it should be noted that the grid stack 200 extends on either side of the active layer 110. In particular, the grid stack 200 is arranged on either side of two active layer/insulating trench interfaces 500 as in the situation of FIG. 4 previously described. In this configuration, the grid stack 200 is therefore arranged above a plurality of structural abnormalities 400 which reduce the reliability of the transistor thus formed. In this figure, the grid stack 200 includes a layer of so-called grid oxide 203 disposed between, and preferably in contact with, the active layer 110 and the grid stack 200.

As previously indicated, it has been identified that the prior art methods cause structural abnormalities 400 at the active layer/insulating trench interfaces 500 and mainly when the active layer 110 and the insulating trench 120 are etched simultaneously, but not exclusively so. These structural abnormalities 400 cause a decrease in the reliability of transistors mainly at the level of the function of the grid stack 200, at least part of which is generally in direct contact with these structural abnormalities 400.

Figure 6A:
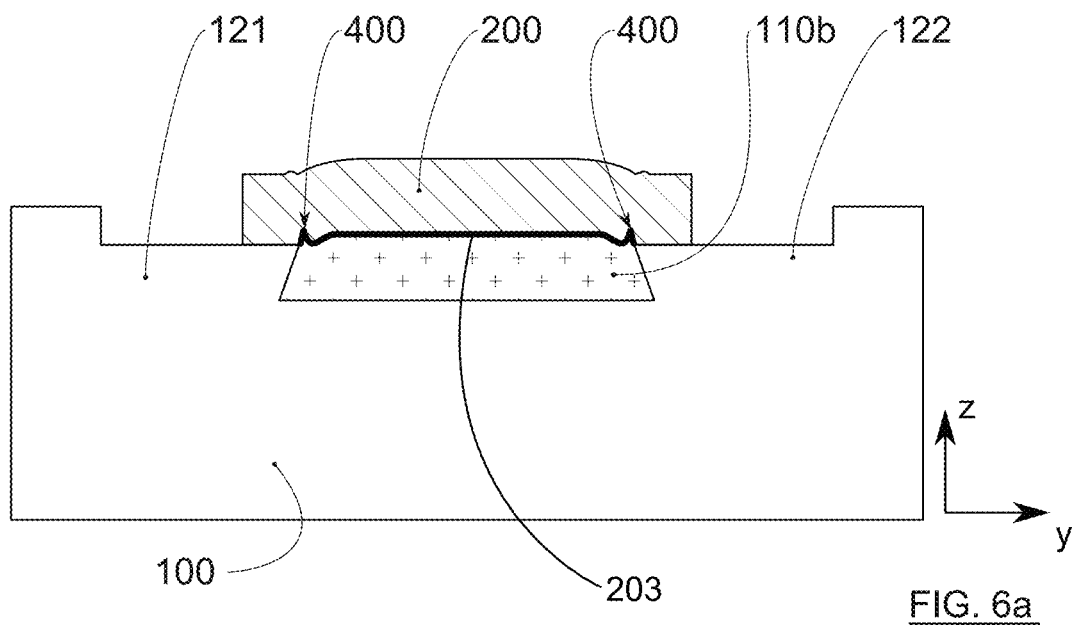
FIGS. 6a, 7a, 8a and 9a represent the positioning of a grid stack above a reception area according to several embodiments of the anterior art.

FIG. 6a shows the case of simultaneous thinning of the active layer 110 and part of the insulating trenches 121 and 122 by dry etching. A dry etching can be, for example, a plasma type etching. This thinning then leads to the formation of structural abnormalities 400 at the interfaces 500 between the thinned active layer and the thinned insulating trench. These 400 structural abnormalities are mainly due to a higher rate of etching of the active layer 110 than that of the 121 and 122 insulating trenches.

Figure 7A:
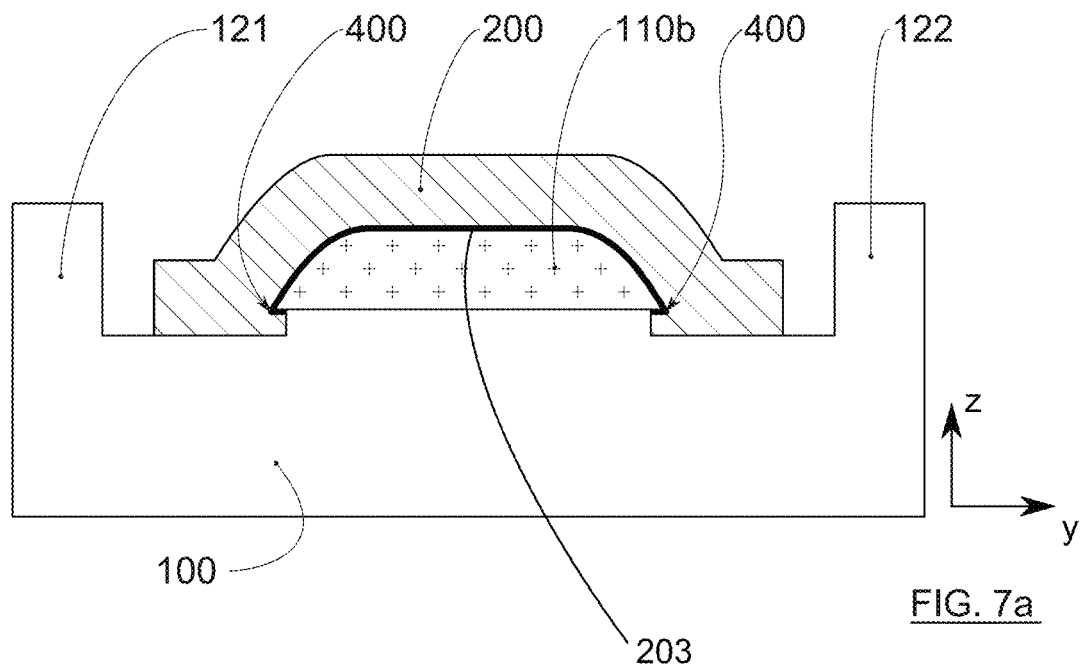

FIG. 7a shows the case of simultaneous thinning of the active layer 110 and part of the insulating trenches 121 and 122 by dry etching, such as plasma. This thinning, which is essentially similar to the case in FIG. 6a, leads to the formation of structural abnormalities 400 at the thinned active layer/thinned insulating trench interfaces 500. These structural abnormalities 400 are due to a lower etching rate of the active layer 110 than of the insulating trenches 121 and 122.

Figure 8A:
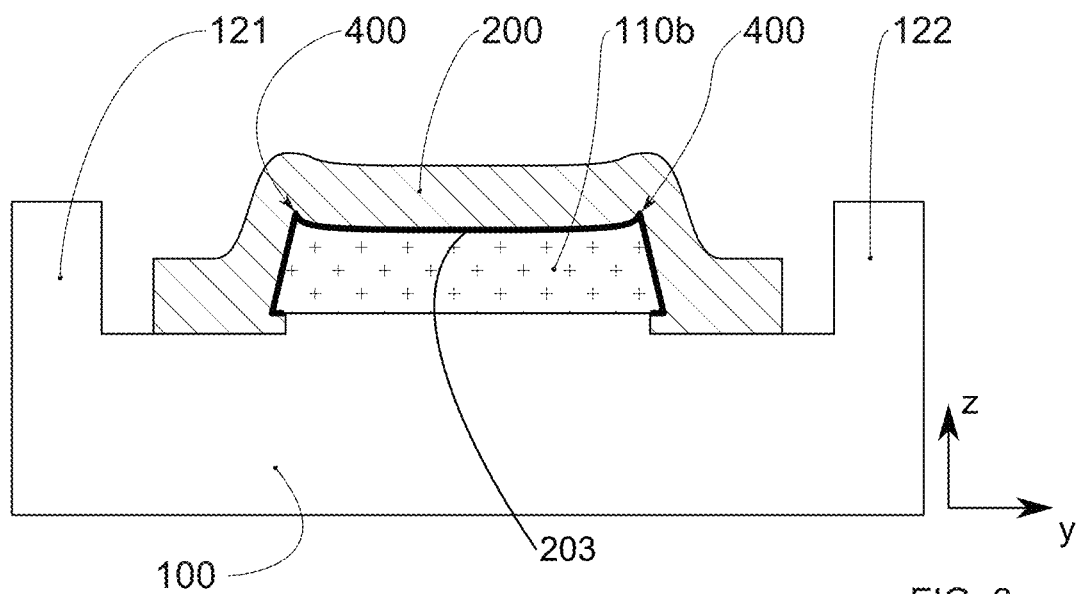
Figure 9A:
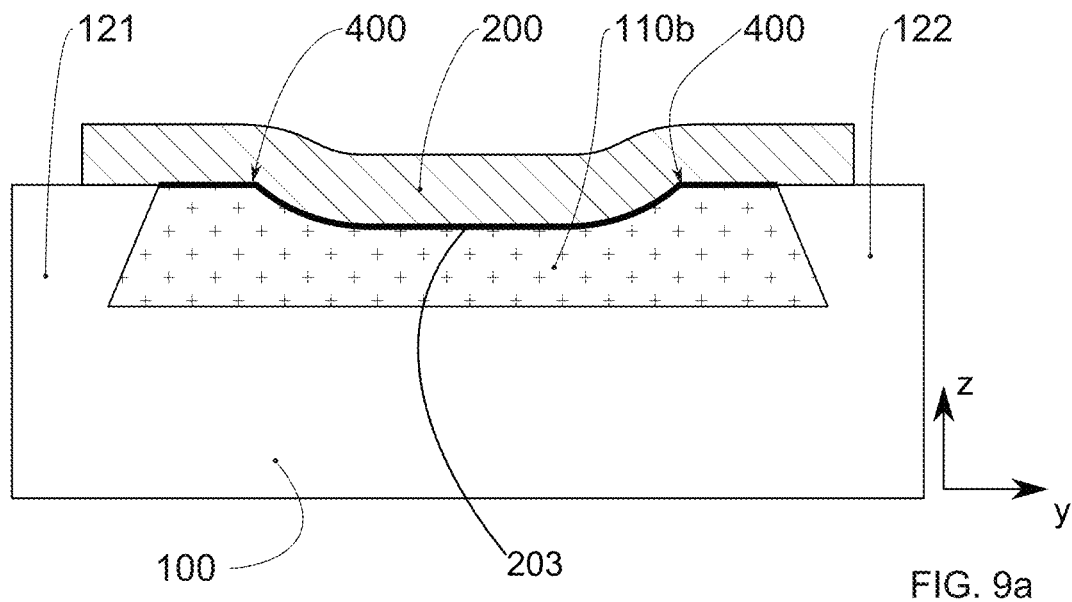

FIGS. 8a and 9a represent a situation of thinning of the active layer 110 by formation and partial or total removal of a sacrificial oxide layer 110c formed from at least a part of the active layer 110. The formation of the sacrificial oxide layer 110c can be achieved by thermal oxidation. The removal of at least part of the sacrificial oxide layer 110c can be achieved by wet etching.

In the case of FIG. 8a, a hard mask 710 is placed at a part of the insulating trenches 121 and 122 so that the step of removing at least part of the sacrificial oxide layer 110c results in the removal of part of the insulating trenches 121 and 122. According to this method of the prior art, the thickness of the sacrificial oxide layer 110c to be removed may be such that it results in a total removal of part of the insulating trenches 121 and 122, exposing BOX 100, or even digging into a part of BOX 100 located under the thinned active layer 110b. This situation leads to the formation of several structural abnormalities 400.

In the case of FIG. 9a, all of the insulating trenches 121 and 122 is protected by a hard mask 710 so that only the active layer 110 is exposed.

FIG. 9a shows the case of a thinning of the active layer 110 by forming and removing a layer of sacrificial oxide 110c without removing the insulating trenches 121 and 122. Indeed, it may be interesting to proceed at such a stage by protecting the insulating trenches 121 and 122 with hard masks 710 for example in order not to remove any material at the active layer/insulating trench interfaces 500.

Nevertheless, it has been observed that even in this situation, structural abnormalities 400 are formed at the thinned active layer/hard mask interfaces 510.

We will now describe FIGS. 6b, 7b, 8b and 9b which compare the results that can be obtained with this invention with the results shown in FIGS. 6a, 7a, 8a and 9a respectively.

Thus, as previously indicated, according to the present invention and as presented in these figures, the grid stack 200 does not extend on either side of the active layer 110. In particular, the grid stack 200 is not placed above structural abnormalities 400.

Indeed, preferably, the grid stack 200 is formed at a homogeneous area of the active layer 110. Indeed, we note that the grid oxide 203 of the grid stack 200 is placed at a homogeneous zone of the active layer 110.

According to the present invention, the conformation of the grid stack 200 on a substantially homogeneous part of the active layer 110 reduces or even avoids any weakness in the electrical insulating role of the grid oxide 203 of the grid stack 200.

Figure 6B:
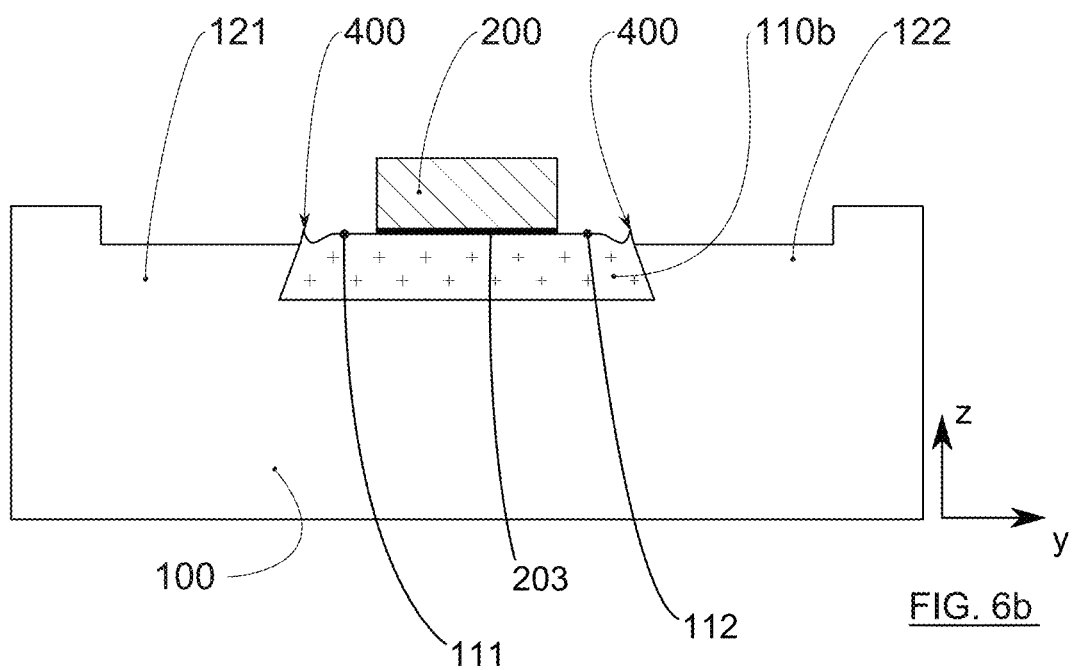
FIGS. 6b, 7b, 8b and 9b represent the positioning of a grid stack above a reception area according to several embodiments of the present invention. In particular, FIGS. 6a, 7a, 8a and 9a representing the prior art have been adapted to the present invention.

Thus, in FIG. 6b, the grid stack 200 is placed above the thinned active layer 110b in an area without structural abnormalities 400 located at the thinned active layer/thinned insulating trench interfaces 500.

Figure 7B:
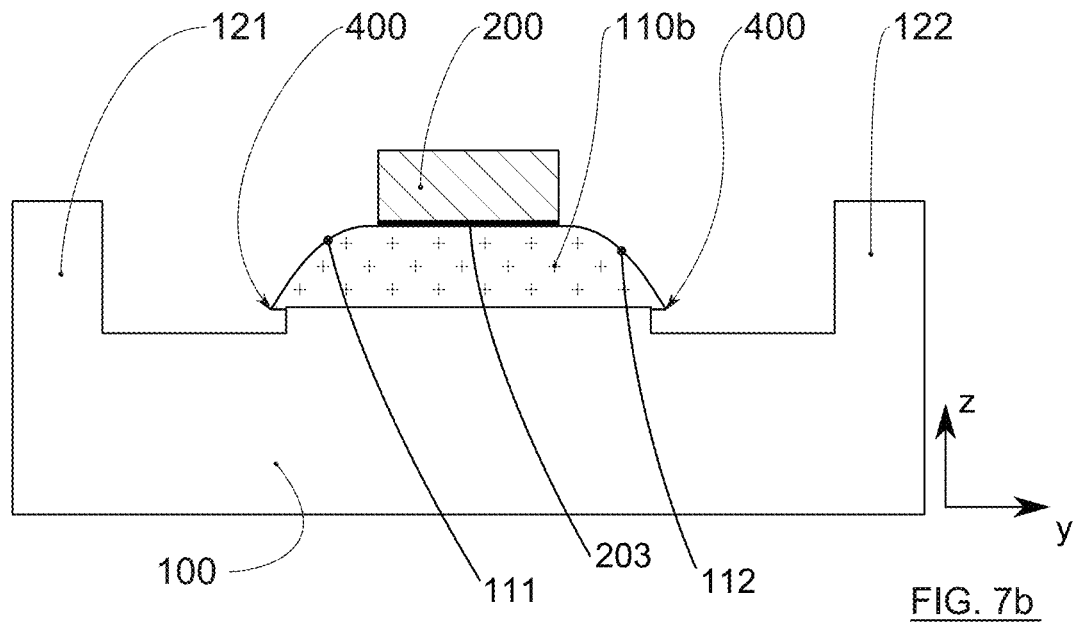

Similarly, in FIG. 7b, the grid stack 200 is located above the thinned active layer 110b, away from structural abnormalities 400. While FIG. 7a shows a conformal deposition of the grid stack 200, FIG. 7b according to this invention shows a localized deposition of the grid stack 200 including grid oxide 203.

Figure 8B:
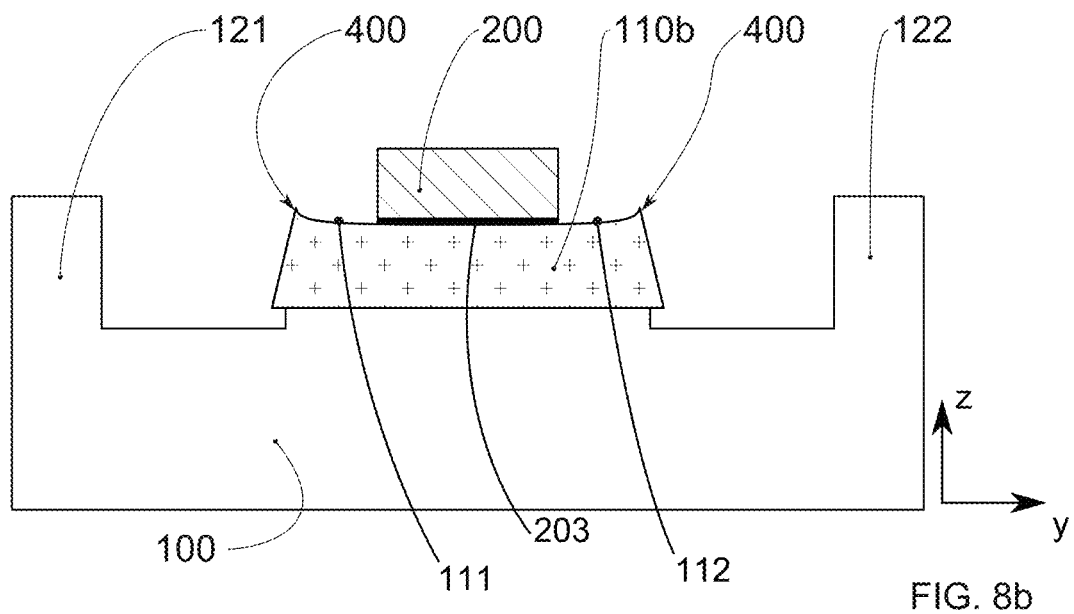

FIG. 8b represents a similar situation to FIG. 7b with a grid stack 200 located substantially in the middle portion of the thinned active layer 110b. This median part is advantageously devoid of structural abnormalities 400.

Figure 9B:
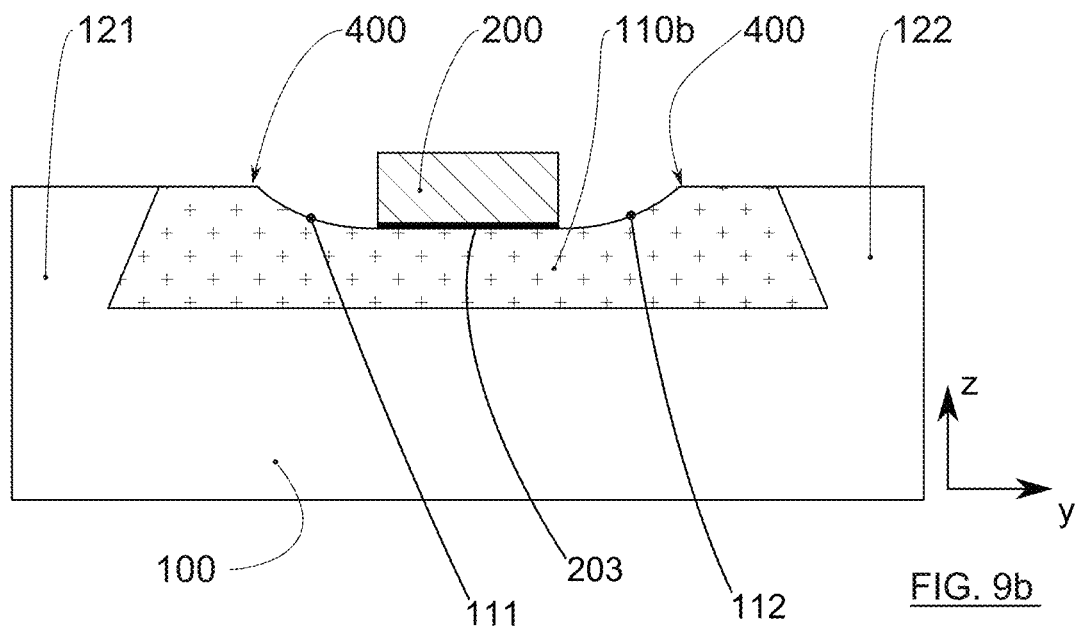

Finally, FIG. 9b describes a situation in which the grid stack 200 is once again substantially arranged in the middle part of the thinned active layer 110b at a distance from the structural abnormalities 400.

Through these various figures presenting a plurality of embodiments of the present invention, the positioning of the grid stack 200 involves the use and/or modification of masks in order to preserve the first and second portions 111 and 112 during the various steps of transistor manufacture.

This invention also applies to the formation of a grid stack 200 on an epitaxial layer 113. This situation can occur when you want to thicken the active layer 110. For this purpose, a thickening step can be carried out. This step can be performed after a previous thinning step if, for example, the surface condition of the active layer 110 requires it. This epitaxial layer 113 may include a material of the same nature as or of a different nature than the active layer 110.

In this type of situation, and depending on how the present invention is carried out, the grid stack 200 can be formed on the epitaxial layer 113 and preferably in a homogeneous area thereof.

As previously presented, according to the present invention, the grid stack 200 is intended to be formed at homogeneous surfaces, i.e. at a distance from structural abnormalities 400.

Advantageously, the grid stack 200 can be designed so that it does not extend to the epitaxial layer/active layer, epitaxial layer/spacer interfaces 520 or epitaxial layer/insulating trench.

As previously presented, a first 301, 303 and 305 and a second 302, 304 and 306 plurality of masks can then be used to mask the areas between sides 201 and 202 of the grid stack 200 and these various interfaces 500, 510 and 520 during the various steps of manufacturing a transistor for example.

According to one embodiment, this invention may include one or more steps of thinning the active layer 110 and thickening the active layer 110 on several occasions. This makes it possible, for example, to clean the surface of the active layer 110 by thinning it before thickening it, or to thicken the active layer 110 before thinning it in order to better control the thickness of the thinned active layer 110b.

Figure 10:
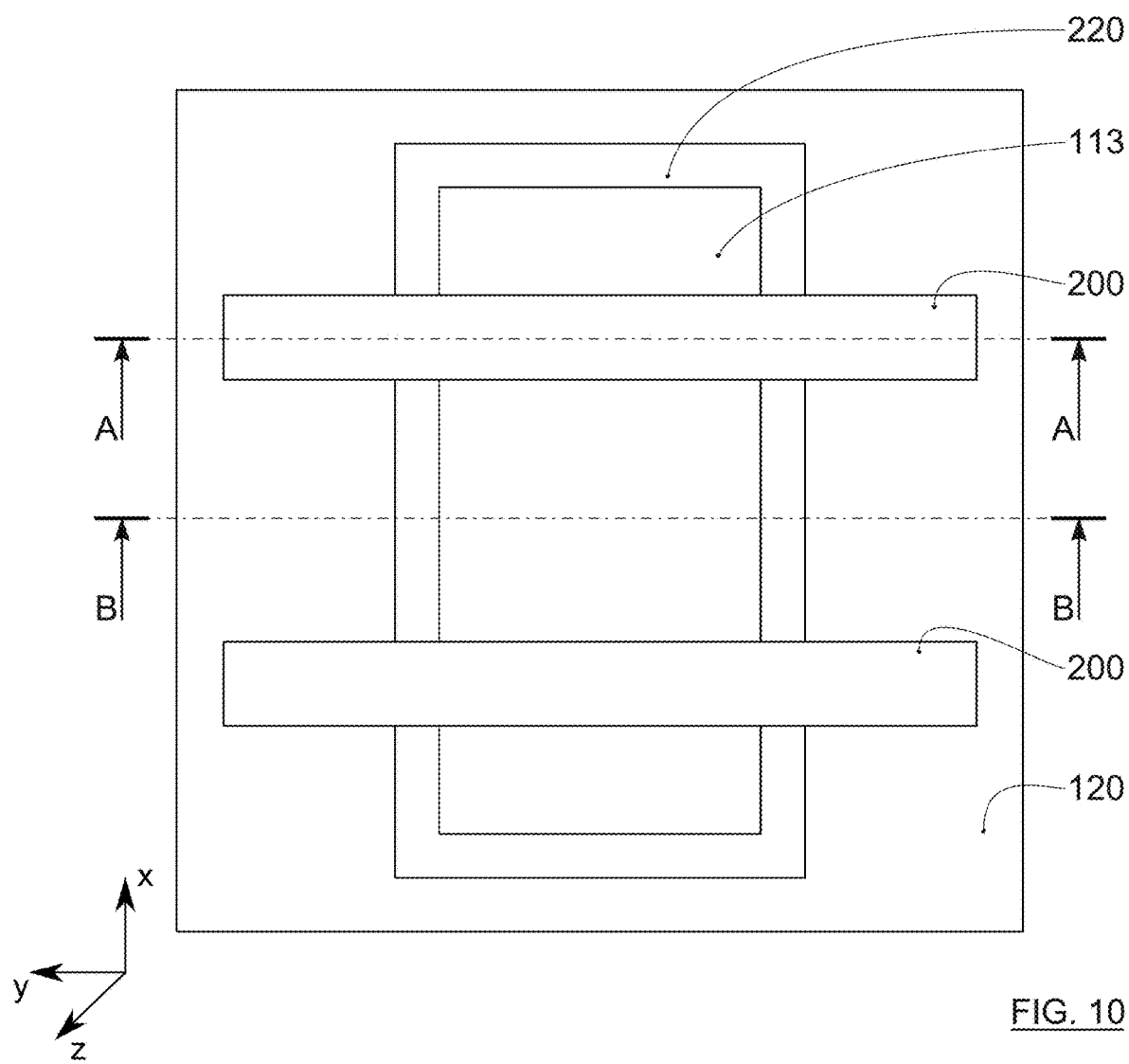
FIG. 10 shows a top view of a microelectronic device according to the previous art comprising two grid stacks extending on either side of a reception area surrounded by an insulating trench.

FIG. 10 shows a microelectronic device comprising two grid stacks 200 extending parallel to each other and on either side of an epitaxial layer 113 according to the prior art. This epitaxial layer 113 is located in part on at least one active layer 110 surrounded by an insulating trench 120.

To be noted is the presence around the periphery of the epitaxial layer 113 of a spacer-forming portion 220. This spacer is typically made of polycrystalline silicon. The spacer 220 is not necessarily an electrical insulator in relation to the epitaxial layer 113. Indeed, it is in fact the result of a potential failure during the formation of the grid stack 200 due to the topology of the reception area after epitaxial growth of the epitaxial layer 113. This formation of spacer 220 is an undesirable consequence of the formation of the grid stack 200 following a thickening step of the active layer 110. Spacers 220 are therefore not desired.

In this figure, the grid stacks 200 have a part arranged at epitaxial layer/spacer interfaces 520, places of structural abnormalities such as those previously discussed.

It was identified during the development of this invention that the step of forming electrical contact zones 6 may result in the formation of a short circuit between a portion of the source zones 2 and/or drain zones 3 and the grid stack 200 at spacer 220, when the grid stack 200 is in contact with the spacers 220 as is the case in the prior art. This situation is therefore detrimental to the proper functioning of the transistor.

It is to be noted that the step of forming electrical contact areas 6 may include a step of depositing an electrically conductive material in the form of a metal layer 230, for example cobalt-based, and a step of silicidation of at least a part of this electrical conductive layer 230.

In particular, this metal layer 230 is silicidated only at electrical contact areas 6. Typically, on the top of the grid stack 200 and on source zones 2 and drain zones 3. The other parts of the metal layer 230, not silicidated, are removed.

Thus, depending on the topology of the exposed surfaces during the step of forming electrical contact zones 6, some surfaces, however, with or without structural abnormalities, may not be properly electrically insulated by the spacers 220. This situation then leads to the formation of an electrical conduction circuit between the active layer 110 and the grid stack 200.

This is an advantageous way to solve this problem.

Figure 11A:
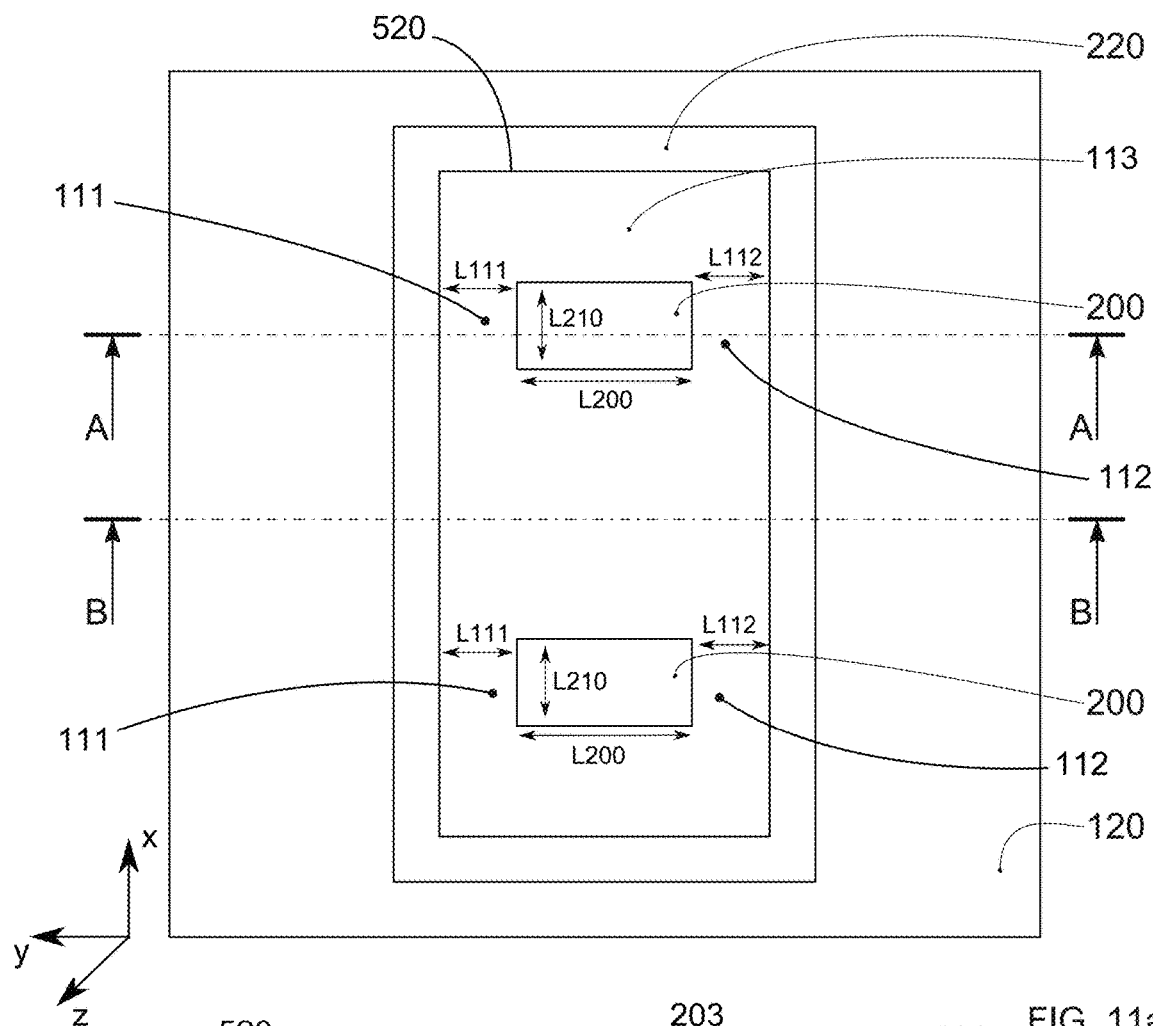
FIG. 11a shows a view from above of a microelectronic device according to an embodiment of this invention.

FIG. 11a shows a microelectronic device comprising two grid stacks 200 according to an embodiment of this invention. These grid stacks 200 are therefore not in contact with the insulating trench 120 nor with an interface between two different types of materials, nor with the spacer 220. In this situation, and as previously indicated, the grid stacks 200 are therefore not placed above or in contact with structural abnormalities 400.

According to this embodiment, the grid stack 200 is not placed in contact with the active layer 110. Indeed, the grid stack 200 is in contact with an epitaxial layer 113 defining a reception area 110a. This epitaxial layer 113 can for example be surrounded by a spacer 220 as previously indicated. This epitaxial layer 113 is made of semiconductor material forming an excess thickness of the active layer 110. This epitaxial layer 113 is formed either of the same material as the active layer 110 or of another material. In the latter case, the epitaxial layer 113 is for example made of SiGe while the active layer 110 is made of Si.

Figure 11B:
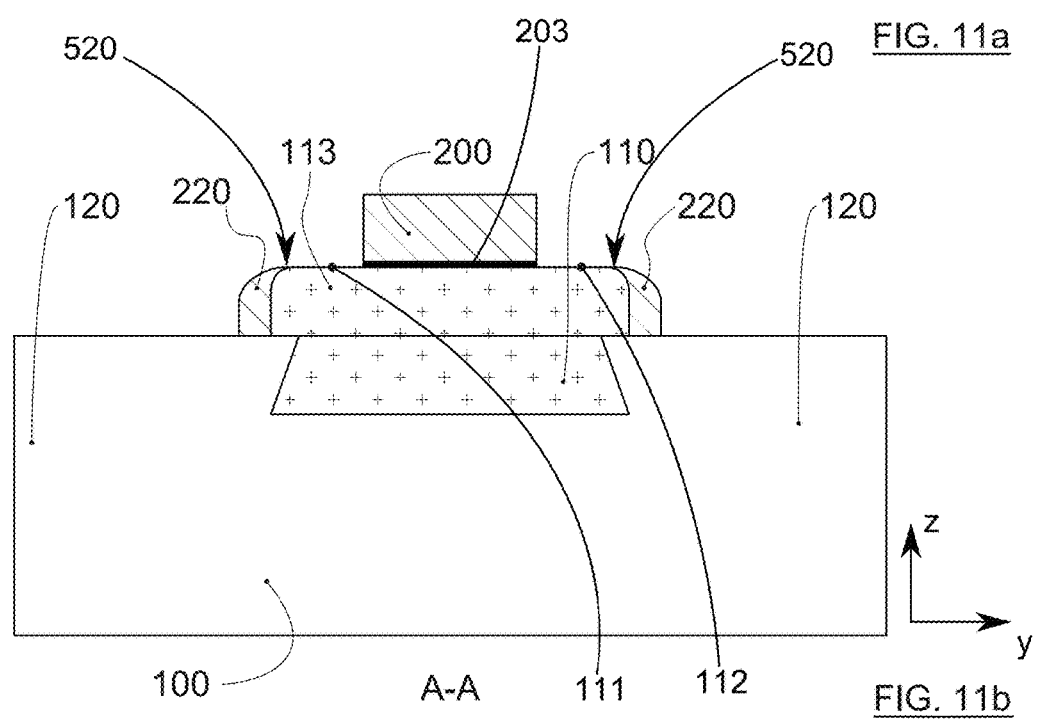

FIG. 11b is a view according to section A-A in FIG. 11a. In this figure it is noted that the grid stack 200 is located in an area lacking structural abnormalities 400, advantageously, the grid stack 200 is thus located and shaped to define a first 111 and second 112 portion of the epitaxial layer 113 not covered by the grid stack 200.

According to this embodiment, the first and second portions 111 and 112, each extend from one of the flanks 201, 202 of the grid stack 200 and up to the spacer 220 surrounding the epitaxial layer 113 defining the reception area 110a.

As before, these first and second portions 111 and 112 are located on either side of the grid stack 200 in the longitudinal direction y.

This figure shows the longitudinal dimensions L111 and L112 of the first 111 and second 112 portions of the reception area 110a, as well as the longitudinal dimension L200 and transverse dimension L210 of the grid stacks 200.

Advantageously, the first portion 111 can be defined as a portion of epitaxial layer 113 defining the reception area 110a located between the first flank 201 of the grid stack 200 and the epitaxial layer/space interface 520.

Similarly, the second portion 112 can be defined as a portion of the reception area 110a defined by the epitaxial layer 113 located between the second flank 202 of the grid stack 200 and the epitaxial layer/space interface 520.

In a clever way, the positioning of the grid stack 200 according to the present invention with respect to the epitaxial layer/spacer interfaces 520 prevents it from being in electrical contact with the spacer 220 which may be in electrical contact with the active layer 110, preferably via the epitaxial layer 113, after the step of forming electrical contact zones 6.

As before and considering that the first 111 and second 112 portions are not covered by the grid stack 200, it is necessary to adapt at least one mask (301, 302, 303, 304, 305, 306) of the plurality of masks of the transistor manufacturing method accordingly in order to protect these first and second portions during the transistor manufacturing steps.

Thus, as previously, a first plurality of masks 301, 303 and 305 and a second plurality of masks 302, 304 and 306 can be shaped so as to protect respectively the first 111 and the second 112 portion, in particular during the formation, by epitaxial growth and/or ion implantation, of at least one of: source zone 2, drain zone 3, electrically conductive zone 5 with the conduction channel, electrical contact zone 6.

Preferably, the extension of the first 301, 303 and 305 and the second 302, 304 and 306 plurality of masks is sufficient to mask the first 111 and second 112 portions respectively, at least part of the epitaxial layer/space interfaces 520, and preferably at least part of the first 201 and second 202 flanks of the grid stack 200 respectively.

Figure 11C:
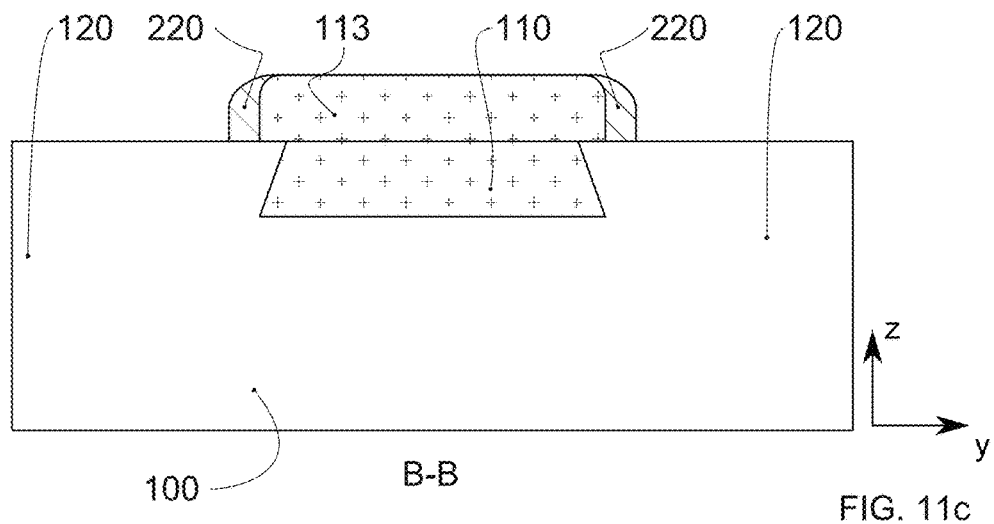

FIG. 11c shows a view according to section B-B in FIG. 11a. This cutting is done at a source zone 2 or drain zone 3. It is to be noted in this figure the presence of spacers 220 on each side of the epitaxial layer 113.

Figure 11D:
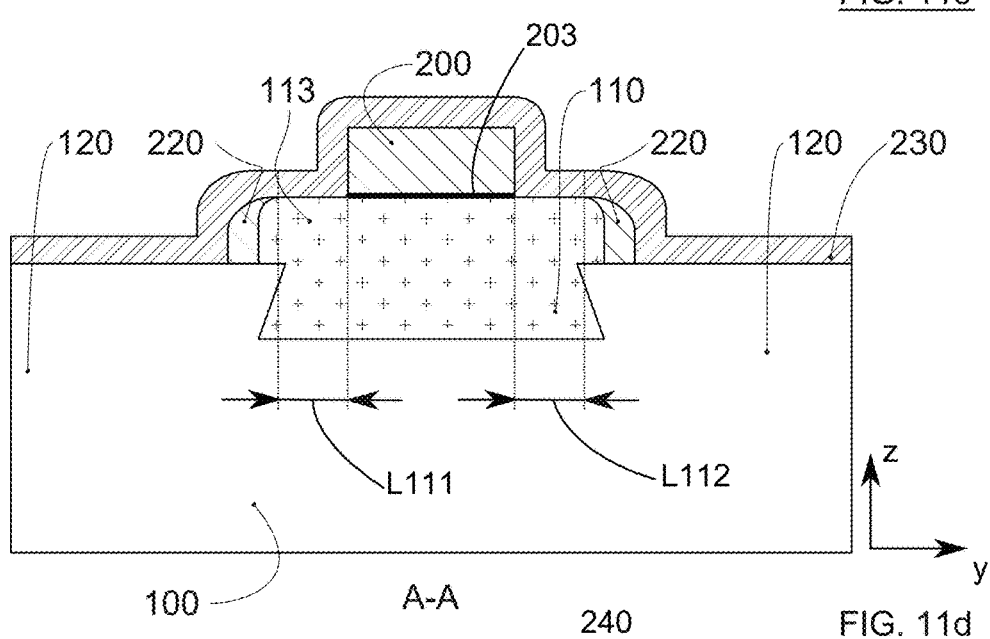
FIGS. 11d and 11e represent two steps in the formation of an electrical contact zone by silicidation according to an embodiment of this invention.
Figure 11E:
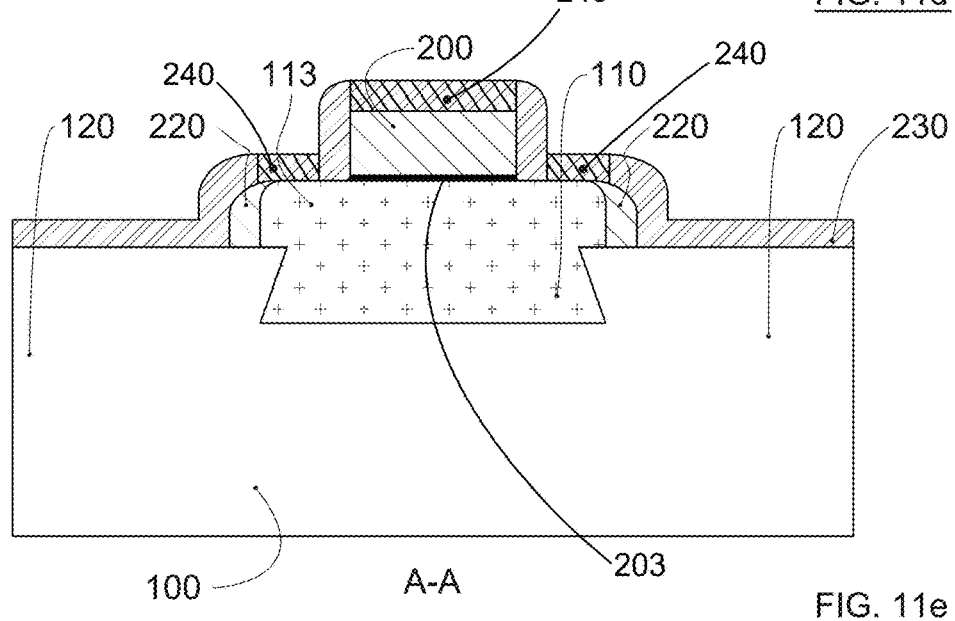

FIGS. 11d and 11e represent respectively a step of depositing a metallic layer 230 and a step of silication, i. e. forming a silicidated zone 240, of a part of this metallic layer 230, in order to form electrical contact zones 6 as previously discussed.

It should be noted that, contrary to the previous art, the silicidation step according to the present invention does not lead to short-circuit formation between the grid stack 200 and the source zone 2 and/or drain zone 3 through the spacers 220 surrounding the epitaxial layer 113.

In particular, the clever positioning of the grid stack 200 at a distance from any interface between different types of materials ensures better reliability of the transistor thus formed.

Thus, in view of the above description, it is clear that the present invention offers an effective solution to improve the reliability of a transistor. The invention is based in particular on a clever configuration and position of the grid stack so as not to be in contact with possible structural abnormalities. This particular layout of the grid stack is supplemented by an adaptation of the masks used in the various stages of the transistor manufacturing method in order to preserve the portions not covered by the grid stack and not intended to form a source, drain, electrical contact or electrically conductive area with a conduction channel.

The invention is not limited to the embodiments previously described and extends to all the embodiments covered by the claims.

REFERENCES

1. Transistor
2. Source Zone
3. Drain Zone
4. Conduction channel
5. Electrically conductive area with the conduction channel
6. Electrical contact zone
100. Insulating layer, BOX
110. Active layer
110a. Reception area
L110. Longitudinal dimension of the reception area
110b. Thinned active layer
110c. Sacrificial oxide layer
111. First portion
L111. Longitudinal dimension of the first portion
112. Second portion
L112. Longitudinal dimension of the second portion
113. Epitaxial layer
120. Insulating trench, STI (Shallow Trench Insulation)
121. First insulating trench, STI (Shallow Trench Insulation)
122. Second insulating trench, STI (Shallow Trench Insulation)
200. Grid stack
L200. Longitudinal dimension of the grid stack
L210. Transverse dimension of the grid stack
201. First flank of the grid stack
203. Grid oxide
202. Second flank of the grid stack
220. Spacer
230. Metal layer
240. Silicidation zone
301. First mask
301a. First geometric centre
302. Second mask
302a. Second geometric centre
303. Third mask
303a. Third geometric centre
304. Fourth mask
304a. Fourth geometric centre
305. Fifth mask
305a. Fifth geometric centre
306. Sixth mask
306a. Sixth geometric centre
400. Structural abnormality
500. Active layer/insulating trench interface 510. Active layer/hard mask interface
520. Epitaxial layer/spacer interface
700. Etching
710. Hard mask

The invention claimed is:

1. A method of forming a transistor from a stack of layers comprising at least one insulating layer topped by at least one active layer of semiconductor material and at least one first and one second insulating trench passing through the active layer to define in the active layer a reception area for receiving said transistor, said transistor comprising a conduction channel formed at least partially in the active layer, the method comprising at least the following steps:
  a) defining said conduction channel at the reception area comprising at least one of the following steps:
    i) thinning a portion of the active layer at the reception area to form a thinned active layer, the thinning step comprising at least:
      (1) either a dry and/or wet etching of at least a part of the active layer at the reception area, or
      (2) forming a sacrificial oxide layer by oxidation of a part of the active layer followed by a removal of at least a part of said sacrificial oxide layer;
    ii) thickening a portion of the active layer at the reception area to form a thickened reception area, the thickening step comprising at least epitaxial growth of a crystalline material at the reception area;
  b) forming a grid stack above at least said conduction channel, said grid stack extending over a first dimension ($L200$), the first dimension being taken in a longitudinal direction (y), above at least said conduction channel; and
  c) forming a source zone and a drain zone, the source zone and drain zone being located on either side of said grid stack in a transverse direction (x) of said grid stack, the transverse direction (x) being perpendicular to said longitudinal direction (y);
    wherein the formation of the grid stack is carried out in such a way as to provide at least a first and a second portion of the reception area, not covered by said grid stack; said first and second portions each extending from a flank of the grid stack and to one of the first and second insulating trenches so that the first and second portions are located on either side of said grid stack in said longitudinal direction (y),
    and wherein the method comprises at least a first step of masking the first and second portions in order to mask the first and second portions when forming the source and drain zones.

2. The method according to claim 1, wherein the definition of said conduction channel at the reception area includes said step of thinning a portion of the active layer at the reception area to form a thinned active layer, the thinning step comprising at least a dry and/or wet etching of at least a portion of the active layer at the reception area.

3. The method according to claim 1, wherein the definition of said conduction channel at the reception area includes said step of thinning a portion of the active layer at the reception area to form a thinned active layer, the thinning step comprising at least forming a sacrificial oxide layer by oxidizing a portion of the active layer followed by removing at least a portion of said sacrificial oxide layer.

4. The method according to claim 1, wherein the definition of said conduction channel at the reception area includes said step of thickening the active layer.

5. The method according to claim 4, comprising, after said step of thickening the active layer, a step of forming at least one spacer around at least a portion of said thickened reception area and wherein the formation of the grid stack is performed in such a way that the first and second portions of the reception area, not covered by said grid stack, each extend from one of the sides of the grid stack to said spacer so that the first and second portions are located on either side of said grid stack in said longitudinal direction (y).

6. The method according to claim 1, wherein the first portion has a second dimension ($L111$) and the second portions have a third dimension ($L112$), respectively, the second dimension and the third dimension being measured in the longitudinal direction (y), these dimensions being such that: $L200 \geq k1*L111$ and $L200 \geq k1*L112$ where $k1 \geq 2$, and in which $L111 \geq k2*L200$ and $L112 \geq k2*L200$ where $k2 \geq 0.05$.

7. The method according to claim 1, wherein said first step of masking the first and second portions comprises positioning at least one mask on top of the first and second portions, said at least one mask having dimensions and being positioned so as to mask:
  entirely the first and second portions,
  parts of the grid stack adjacent to the first and second portions and/or
  parts of the first and/or second insulating trenches adjacent to the first and/or second portions.

8. The method according to claim 1, comprising at least one step of forming at least one electrically conductive zone with the conduction channel, said step of forming at least one electrically conductive area with the conduction channel comprising positioning at least one mask on top of the first and second portions so as to mask the first and second portions during said step of forming at least one electrically conductive area with the conduction channel, said at least one mask having dimensions and being positioned so as to mask:
  entirely the first and second portions,
  parts of the grid stack adjacent to the first and second portions and/or
  parts of the first and/or second insulating trenches adjacent to the first and/or second portions.

9. The method according to claim 1, comprising at least one step of forming at least one electrical contact zone, said step of forming at least one electrical contact zone comprising positioning at least one mask on top of the first and second portions so as to mask the first and second portions during said step of forming at least one electrical contact zone, said at least one mask having dimensions and being positioned so as to mask:
  entirely the first and second portions,
  parts of the grid stack adjacent to the first and second portions and/or
  parts of the first and/or second insulating trenches adjacent to the first and/or second portions.

10. The method according to claim 1, wherein the first step of masking said first and second portions of the reception area comprises at least the following steps:
  a) conforming a first mask having a polygonal shape including a first geometric centre;
  b) positioning said first mask at said first portion of the reception area so that said first geometric centre is located on top of a geometric centre of said first portion;
  c) conforming a second mask having a polygonal shape including a second geometric centre;

d) positioning said second mask at said second portion of the reception area so that said second geometric centre is located on top of a geometric centre of said second portion.

11. The method according to claim 10, wherein the first mask extends from the first geometric centre (301a) over a distance between 10 nm and 1200 nm; and wherein the second mask extends from the second geometric centre over a distance between 10 nm and 1200 nm.

12. The method according to claim 10, wherein the conforming and positioning of the first mask is configured so that said first mask is located on top of said first portion of the reception area, at least a portion of said grid stack and at least a portion of the first insulating trench, and wherein the conforming and positioning of the second mask is configured so that said second mask is located on top of said second portion of the reception area, at least a portion of said grid stack and at least a portion of the second insulating trench.

13. The method according to claim 1, comprising at least one step of forming at least one electrically conductive zone with the conduction channel, said step of forming at least one electrically conductive zone with the conduction channel comprising a second step of masking said first and second portions of the reception area when forming the electrically conductive zone with the conduction channel.

14. The method according to claim 13 in which the second step of masking said first and second portions of the reception zone comprises at least the following steps:
 a) conforming a third mask having a polygonal shape including a third geometric centre;
 b) positioning said third mask at said first portion of the reception zone so that said third geometric centre is located on top of a geometric centre of said first portion;
 c) conforming a fourth mask having a polygonal shape including a fourth geometric centre;
 d) positioning said fourth mask at said second portion of the reception zone so that said fourth geometric centre is located on top of the geometric centre of a second portion.

15. The method according to claim 14, wherein the conforming and positioning of the third mask is configured so that said third mask is located on top of said first portion of the reception zone, at least a portion of said grid stack and at least a portion of the first insulating trench, and wherein the conforming and positioning of the fourth mask is configured so that said fourth mask is located on top of said second portion of the reception zone, at least a portion of said grid stack and at least a portion of the second insulating trench.

16. The method according to claim 14, wherein the third mask and the fourth mask are merged in a single shaped mask for the step of forming said electrically conductive area with the conduction channel.

17. The method according to claim 14 comprising at least one step of forming at least one electrical contact zone, said step of forming at least one electrical contact zone comprising a third step of masking said first and said second portions of the reception zone so that the first and second portions of the reception zone are not exposed when forming the electrical contact zone.

18. The method according to claim 17, wherein the third step of masking said first and second portions of the reception zone comprises at least the following steps:
 a) conforming a fifth mask having a polygonal shape including a fifth geometric centre;
 b) positioning said fifth mask at said first portion of the reception zone so that said fifth geometric centre is located on top of a geometric centre of said first portion;
 c) conforming a sixth mask having a polygonal shape including a sixth geometric centre;
 d) positioning said sixth mask at said second portion of the reception zone so that said sixth geometric centre is located on top of the geometric centre of said second portion.

19. The method according to claim 18, wherein the conforming and positioning of the fifth mask is configured so that said fifth mask is located on top of said first portion of the reception zone, at least a portion of said grid stack and at least a portion of the first insulating trench, and wherein the conforming and positioning of the sixth mask is configured so that said sixth mask is located on top of said second portion of the reception zone, at least a portion of said grid stack and at least a portion of the second insulating trench.

20. Method of manufacturing transistors having channels of different thicknesses on a same stack of layers comprising at least one insulating layer surmounted by at least one active layer made of a semiconductor material and by at least one first and one second insulating trench passing through the active layer to define in the active layer a reception zone intended to accommodate each transistor, wherein only some of the transistors are formed by the method according to claim 1, so that a plurality of the transistors in the stack have channels whose thicknesses are different from the thicknesses of the channels of the other transistors in the stack.

* * * * *